United States Patent
Forden et al.

(10) Patent No.: US 11,288,228 B2
(45) Date of Patent: Mar. 29, 2022

(54) OPERATIONS AND MAINTENANCE FILE PROTECTION PROCESSES

(71) Applicant: Innovative Process Technologies, LLC, Peoria, AZ (US)

(72) Inventors: Holly Marie Forden, Peoria, AZ (US); Christopher Alan Bresciani, Phoenix, AZ (US); Laura Lee Allen, Surprise, AZ (US)

(73) Assignee: Innovative Process Technologies, LLC, Peoria, AZ (US)

( * ) Notice: Subject to any disclaimer, the term of this patent is extended or adjusted under 35 U.S.C. 154(b) by 457 days.

(21) Appl. No.: 16/036,898

(22) Filed: Jul. 16, 2018

(65) Prior Publication Data
US 2022/0066984 A1 Mar. 3, 2022

Related U.S. Application Data

(60) Provisional application No. 62/645,084, filed on Mar. 19, 2018, provisional application No. 62/532,703, filed on Jul. 14, 2017.

(51) Int. Cl.
*G06F 16/11* (2019.01)
*G06F 16/18* (2019.01)
*G06F 16/174* (2019.01)
*G06F 16/14* (2019.01)
*G06F 30/00* (2020.01)

(52) U.S. Cl.
CPC ......... *G06F 16/116* (2019.01); *G06F 16/148* (2019.01); *G06F 16/174* (2019.01); *G06F 16/1873* (2019.01); *G06F 30/00* (2020.01)

(58) Field of Classification Search
None
See application file for complete search history.

(56) References Cited

U.S. PATENT DOCUMENTS 5,138,697 A * 8/1992 Yamamoto ............... G06F 30/00 345/420
2010/0251028 A1* 9/2010 Reghetti .................. G06F 30/13 714/39

* cited by examiner

*Primary Examiner* — Giuseppi Giuliani
(74) *Attorney, Agent, or Firm* — Todd Allen Serbin, Esq.

(57) ABSTRACT

Operations and maintenance design drawing maintenance, As-Built drawing conformance, and record drawing conformance processes for protecting the integrity of dynamically modified files.

20 Claims, 26 Drawing Sheets

O & M Design Drawing Maintenance Process

INDICATES WORKFLOW

INDICATES ALTERNATIVE WORKFLOW

STEP 1
Download or Copy Record Drawing File from Document Management System (DMS) or File Repository

STEP 2
Conform Record Drawing File for CADD Standards and proper modelspace/paperspace usage Reindex into DMS or File Repository

STEP 3
Rename the conformed Record Drawing File to create Interim Parent File. D- prefix to Record Drawing File name in addition to a unique suffix project number identifier.

STEP 4
Create Demolition and Correctives Layers in the Interim Parent File

STEP 5
Change demolition objects to the DEMOLITION Layer in the Interim Parent File

STEP 6
Create a new Design XREF File. Save file with X- prefix and matching Interim Parent File name with matching unique suffix project number identifier.
Externally Reference (overlay) in Interim Parent File and Freeze demolition and correctives layers.
Add new design entities using layering standards that match exactly to the corresponding Interim Parent File.

STEP 7
Copy Objects to be placed on the CORRECTIVES layer *(if required)* in the Interim Parent File to the Design XREF File and force the color of the corrective objects to grayscale. *Move* the CORRECTIVES objects to the desired location within the Design XREF File and/or *Correcting* objects.

STEP 8
Create a new Demolition Construction Sheet File and externally reference in the Interim Parent File and grayscale all layers except the DEMOLITION layer, and FREEZE the CORRECTIVES layer *(if it is being used to remove an existing condition)*. Place all key notes/Demolition notes, revision clouds and call out leaders on the appropriate layers in paper space.

STEP 9
Create a new Design Construction Sheet File and externally reference in the Interim Parent File and grayscale all of the Interim Parent File layers, FREEZE the DEMOLITION layer, and FREEZE the CORRECTIVES layer. Externally reference in the Design XREF File, and place all key notes/construction notes, revision clouds and call out leaders on the appropriate layers in paper space.

Step 1. Download or Copy Record Drawing Files From Document Management System or File Repository To Record Project Parent File Folder

OPERATIONS AND MAINTENANCE FILE PROTECTION PROCESSES

RELATED APPLICATIONS

This application claims the benefit of priority under 35 U.S.C. § 119(e) of U.S. Patent Application No. 62/532,703 filed Jul. 14, 2017 and U.S. Patent Application No. 62/645,084 filed Mar. 19, 2018, the contents of which are incorporated herein by reference in their entirety.

FIELD AND BACKGROUND OF THE INVENTION

The present invention, in some embodiments thereof, relates to information technology and, more particularly, but not exclusively, to enhancement and optimization of tasks using information technology.

SUMMARY OF THE INVENTION

There is provided in accordance with an aspect of the invention, an operations and maintenance design drawing conformance process, comprising:

Step 1—Download or copy the Record Drawing File from a Document Management System;

Step 2—Conformance of the Record Drawing File;

Step 3—Rename the completed conformed Record Drawing File with a unique prefix identifier that represents the demolition XREF file type and unique suffix identifier that represents a project number; This file will be referred to as the Interim Parent File and represents existing conditions and items to be removed during construction activities, and demolition items that will be eventually removed from the Final Record Drawing during the Operations and Maintenance (O&M) Record Drawing File Conformance Process. Save this file in a separate directory designated for XREF Files used for file compositions in the Demolition and Design Construction Sheet Files;

Step 4—Create a layer (DEMOLITION) that will represent the demolition or items to be removed during construction activities in the Interim Parent File and set to a color that will be specific for items to be removed;

Step 5—Change demolition objects to the DEMOLITION layer within the Interim Parent File;

Step 6—Create a new Design XREF File with a unique prefix identifier that represents the design XREF file type and unique suffix identifier that represents a project number that matches the corresponding Interim Parent File from step 3; This will be referred to as the Design XREF File and represents new items installed during construction activities and that will eventually be added to the Final Record Drawing during the Operations and Maintenance (O&M) Record Drawing File Conformance Process. Save this file in a separate directory designated for XREF Files used for file compositions in the Demolition and Design Construction Sheet Files;

Step 7—Create a CORRECTIVES layer ERASE-AB (if required) Interim Parent File (XREF), Step 7a—Alternative Workflow For Correcting Existing Items, Step 7b—Alternative Workflow For Moving or Deleting Existing Items;

Step 8—Create a new Demolition Construction Sheet File (Using Interim Parent file name with a unique suffix identifier after the project number suffix to represent the demolition construction document files). Externally reference into the Demolition Construction Sheet File the corresponding Interim Parent File using overlay the method and grayscale all layers except the DEMOLITION layer, and FREEZE the CORRECTIVES layer (if it is being used to remove an existing condition) save this file in a separate directory designated for Construction Documents to be plotted and distributed for construction activities; and, Step 9—Create a new Design Construction Sheet File (Using the corresponding Interim Parent file name without prefix and with a corresponding project number suffix to represent the design construction document file) and externally reference, using the overlay method in the corresponding Interim Parent File and grayscale all of the Interim Parent File layers, FREEZE the DEMOLITION layer, and FREEZE the CORRECTIVES layer. Externally reference into the Design Construction Sheet File, using the overlay method the corresponding Design XREF file and Interim Parent File. Save this file in a separate directory designated for Construction Documents to be plotted and distributed for construction activities.

There is further provided in accordance with an aspect of the invention, an operations and maintenance as-built drawing conformance process, comprising:

Step 1—Update (conform) the Interim Parent File. Make necessary revisions to the Interim Parent File if necessary for any field revisions that occurred during construction activities. (Do not rename these files);

Step 2—Update (conform) the Design XREF File. Make necessary revisions to the Design File if necessary for any field revisions that occurred during construction activities. (Do not rename these files);

Step 3—Update Revision Block in the DEMOLITION Construction Sheet File (Contract Document). Delete all key notes/Demolition notes and call out leaders from paper space;

Step 4—Update Revision Block in the Design Construction Sheet File (Contract Document); and, Step 5—Route Conformed As-Built Drawings (Design Construction Sheet Files and Demolition Construction Sheet Files—Conformed Construction Contract Document) internal of the O&M Organization for approvals to consume this information into the Record Drawing File.

There is further provided in accordance with an aspect of the invention, an operations and maintenance record drawing conformance process, comprising:

Step 1—Download or copy the Record Drawing File from a Document Management System (or file repository if applicable) to the working location;

Step 2—Using AutoCAD Map's GIS software functionality, query in the demolition and corrective layers from the Interim Parent File into the Record Drawing File. Perform the Delete duplicates operation to remove Parent File (Record Drawing File) entities that appear on the Demolition and Correctives Layers that were queried in from the corresponding Interim Parent File;

Step 3—Delete Demolition and Correctives Layers Previously queried into the Record Drawing File;

Step 4—Bind Design XREF File into the Record Drawing File; and explode or alternatively, query all Design XREF layers into the Record Drawing File;

Step 5—Plot Record Drawing and route for final approvals prior to indexing the Finalized Record Drawing into the document management system or file repository.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided. A display and/or a user input device such as a keyboard or mouse are optionally provided.

BRIEF DESCRIPTION OF THE SEVERAL VIEWS OF THE DRAWING(S)

Some embodiments of the invention are herein described, by way of example only, with reference to the accompanying drawings and images. With specific reference now to the drawings and images in detail, it is stressed that the particulars shown are by way of example, are not necessarily to scale, and are for purposes of illustrative discussion of embodiments of the invention. In this regard, the description taken with the drawings makes apparent to those skilled in the art how embodiments of the invention may be practiced.

DESCRIPTION OF SPECIFIC EMBODIMENTS OF THE INVENTION

Figure 1:
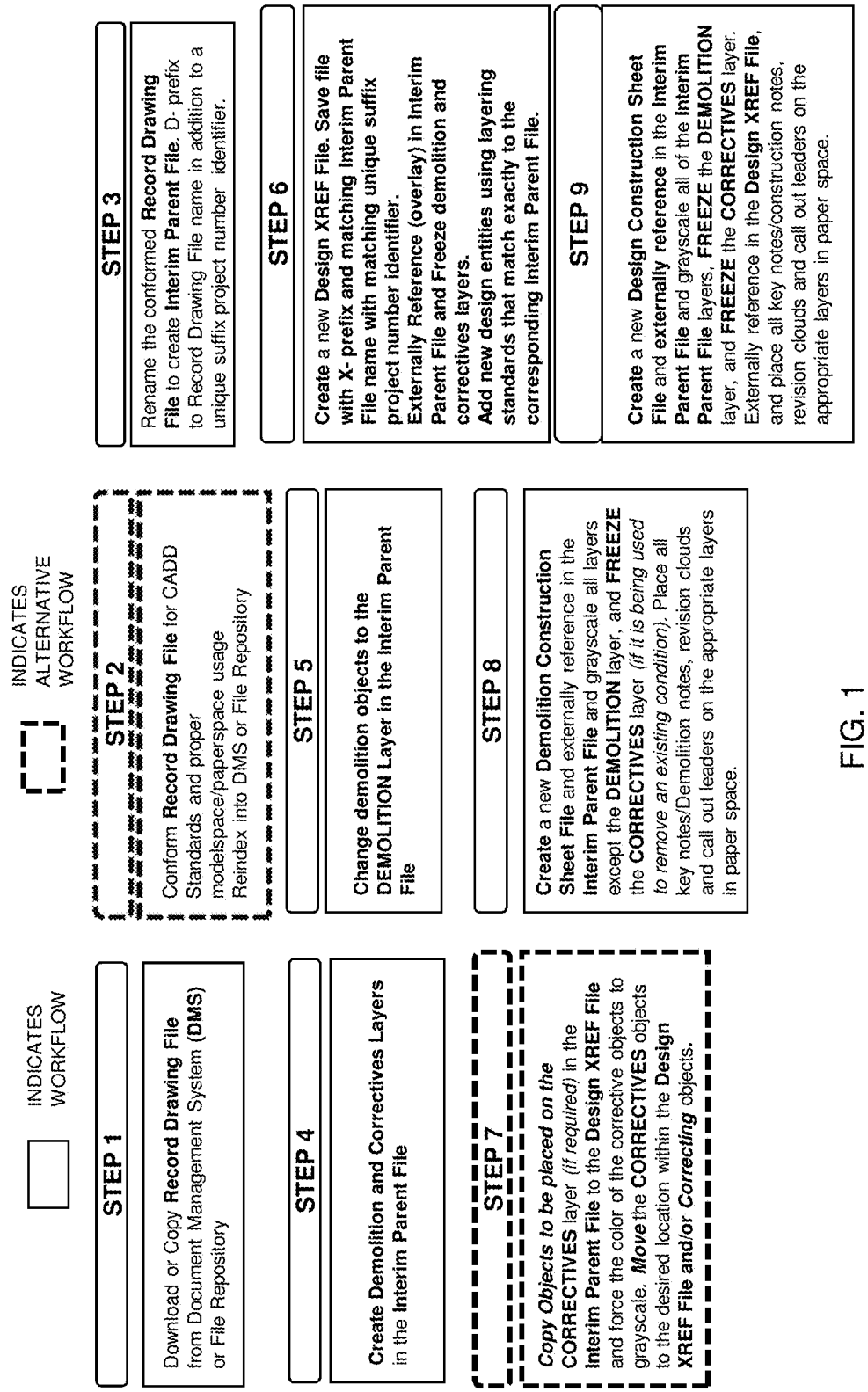
FIG. 1 is a flowchart showing an exemplary Operations and Maintenance Design Drawing Conformance Process, in an aspect.

The present invention, in some embodiments thereof, relates to information technology and, more particularly, but not exclusively, to enhancement and optimization of tasks using information technology.

Before explaining at least one embodiment of the invention in detail, it is to be understood that the invention is not necessarily limited in its application to the details of construction and the arrangement of the components and/or methods set forth in the following description and/or illustrated in the drawings. The invention is capable of other embodiments or of being practiced or carried out in various ways.

Generally, without competent drawing content management policies and procedures in place, operations, asset and risk management, which require exceptional management and operational focus to succeed, become even more daunting challenges, most especially in the utility and facility management industries worldwide.

Utility and facility organizations are often faced with the challenge of working with dynamically changing computer aided drafting and design (CADD) files during the DESIGN, AS-BUILT and RECORD process of Operations and Maintenance ("O&M") utility or facilities upgrades. Complicating the issue further, it is not unreasonable for this problem to be exacerbated by multiple concurrent designs, As-Builts and/or record drawing updates utilizing the same Record Drawing File. It should be understood that the processes described herein are intended to enable utility and facility maintenance industries worldwide to efficiently and effectively manage and maintain these dynamically changing O&M record drawings. For example, the processes described herein reduce and/or eliminate the possible loss and/or overwrite of data that may occur while trying to update and maintain dynamically changing Record Drawing Files.

While the following process examples utilize Autodesk® software, it can be incorporated for use in any commercially available CADD application currently and/or in the future for sale in the engineering industry.

The following defined terms are used throughout this description:

As-Built: A term used to describe the approved final construction conditions of a project.

Block: Multiple CADD drawing entities combined into one group.

Demolition Construction Sheet File (a.k.a. "Demo Sheet"): CADD drawing file Construction Contract Document used to show demolition items.

Design File: CADD drawing file that reflects a new design.

Design Construction Sheet File: CADD drawing file Construction Contract Document used to show new design items.

Interim Parent File: a copy and renamed Record Drawing File that has been conformed to meet proper layering standards, organizational CADD standards, and modelspace and paperspace usage. In essence, it is a "snap shot in time"

used to convey existing conditions, demolition and correctives that occur during the design and construction phases of a project.

Record Drawing File (Also referred to as a Parent File): A recorded CADD drawing file document that retains historical information for every approved As-Built Revision change that has occurred since its first record drawing release.

XREF: A designation for a file that will be used for externally referencing one CADD drawing file into another CADD drawing file. For example, The Interim parent File will be externally referenced into the Demo and Design Construction sheet files and the Design XREF file will be externally referenced into the Design Construction Sheet File.

Externally Referencing: A method of file composition where one CADD drawing file is designated to be overlaid (externally referenced) into another CADD drawing file. Paper space items in the XREF files are ignored and model space items are viewable/printable.

Referring now to the drawings, FIG. 1 is a schematic flowchart showing an exemplary O&M Design Drawing Conformance Process for protecting the integrity of dynamically modified files, in an aspect. Exemplary actions taken are described in more detail with respect to FIGS. 2-12, below.

Figure 2:
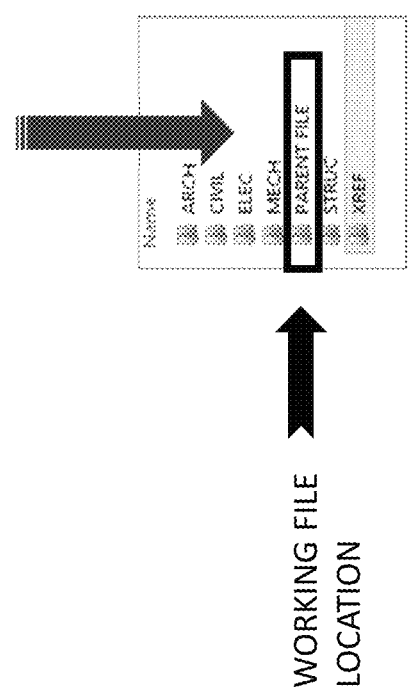
FIGS. 2-12 show exemplary and/or alternative actions performable with an Operations and Maintenance Design Drawing Conformance Process, in an aspect.

FIG. 2 shows a detailed screenshot view of performing a Step 1—Download or copy the Record Drawing File from a Document Management System (or file repository if applicable). This step is performed internal of O&M organization. Project Preliminary Design Files: Record Drawing File.dwg(s) (PARENT FILE) are downloaded from Document Management System or File Repository to the Project Parent File Folder.

Figure 3:
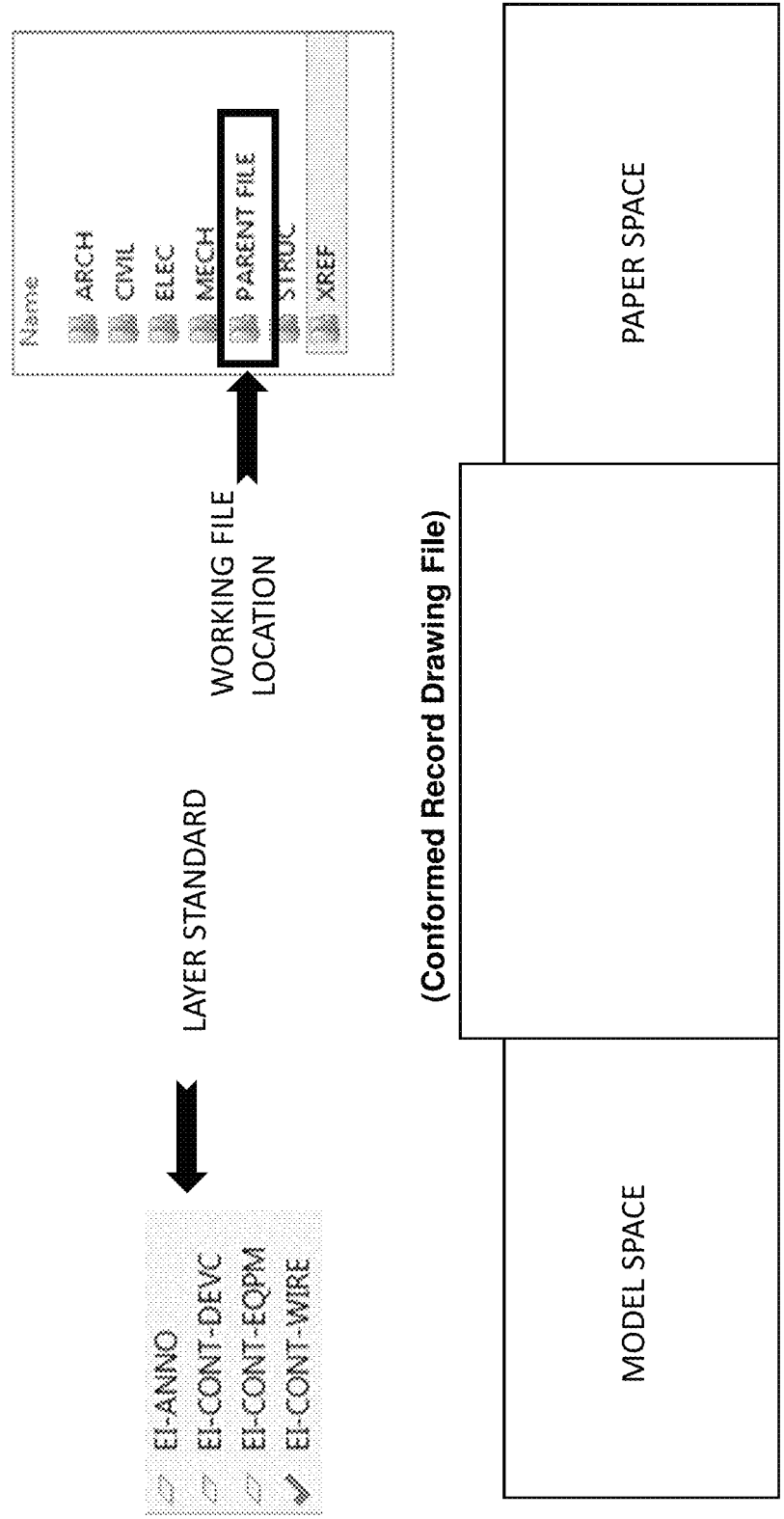
Figure 4:
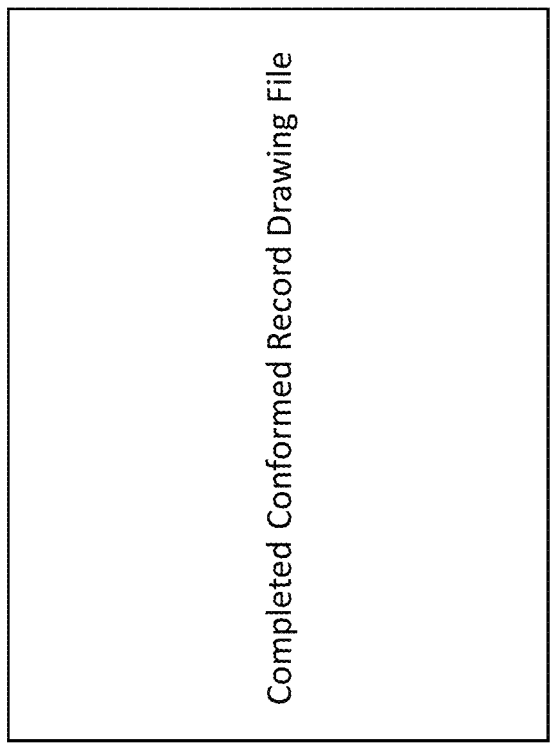

FIG. 3 shows a detailed screenshot view of performing a Step 2—Conformance of the Record Drawing File will consist of converting recorded historical information potentially located in paper space that will be displayed throughout the Design process to model space. Layer standards will also be validated and applied. Borders will be validated as externally referenced entities (Non-Variable linework for the O&M Organization) and Border Informational Text will be inserted into the paper space layout to allow for Variable information to be managed and maintained (allowing for mapped values into a Document Management System). This completed conformed drawing should be immediately re-indexed into the DMS or File Repository if this step is required of the file. This step is an alternative workflow and may not be necessary if modelspace and paperspace are properly used and layering standards have been standardized and strictly enforced previously FIG. 4 shows a detailed screenshot view of performing a Step 3—Rename the completed conformed Record Drawing File with a prefix, in this process documentation as an example, it could be D—followed by the original Record Drawing File name and a suffix that allows for a Unique Project Identifier Number. This Unique Identifier will allow the organization to discern that an edit (items to be removed) to an existing Record Drawing File will be required in the O&M Record Drawing File Conformance Process and also prevent overwrite of data by concurrent changes occurring to the same Record Drawing File. This new file will be referred to as the Interim Parent File in some embodiments of this process. Save this file in a separate directory designated for XREF Files used for file compositions in the Demolition and Design Construction Sheet Files.

In this example, we copy the completed Conformed Record Drawing File into the project work order/Contract Number XREF folder and rename to a Unique Naming Convention that is a derivative of the Record Drawing File name. This prevents overwrites of concurrent Interim Parent File changes being processed on the same Record Drawing File. Exemplary working files or file names include:

D-PARENT FILENAME-Project Number.DWG—Internal Project Number or D-PARENT FILENAME-Contract Number.DWG—External Consultant Project Number. (Border Information and revision block shall remain in paperspace—without edits.)

Figure 5:
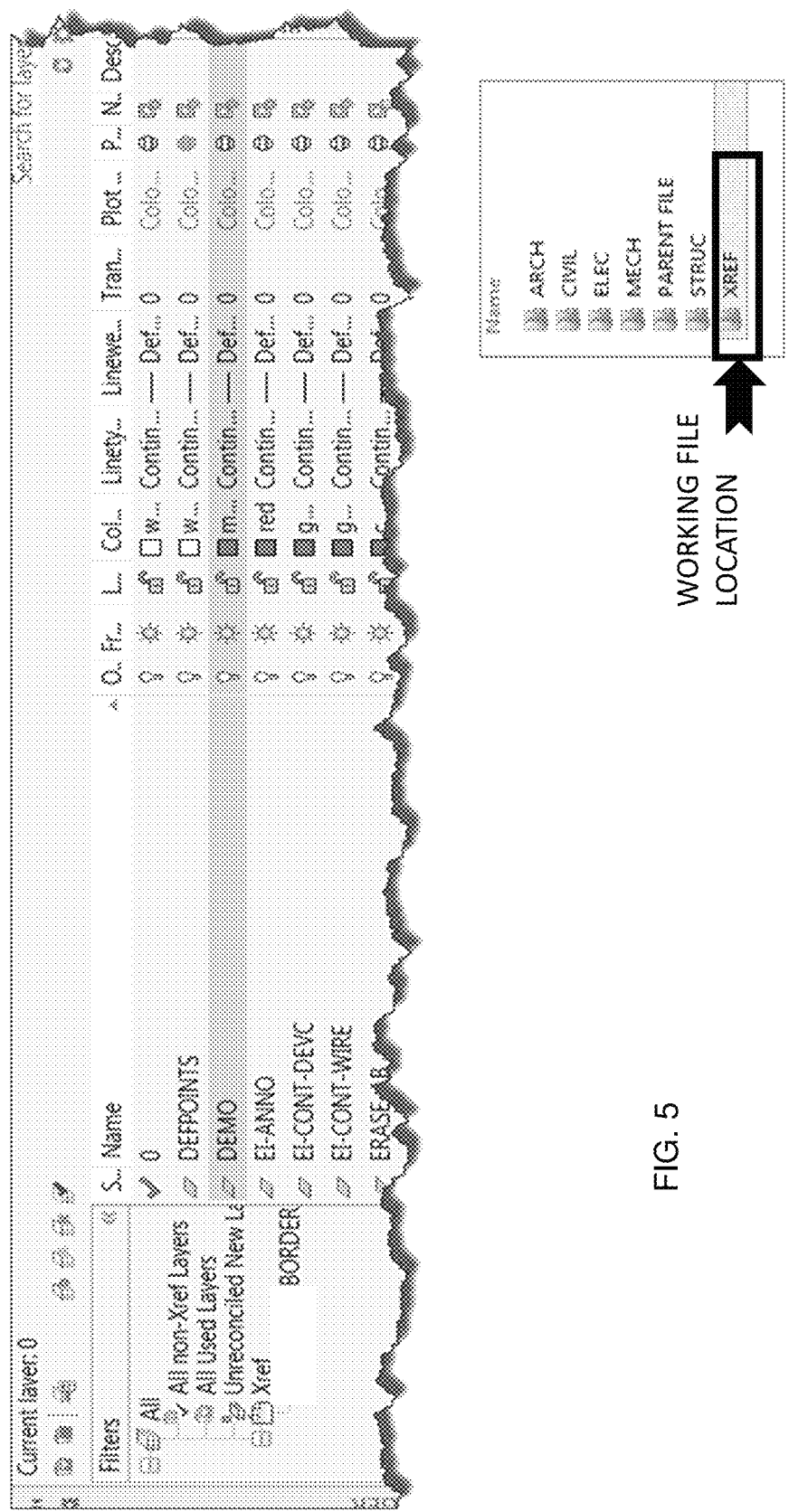

FIG. 5 shows a detailed screenshot view of performing a Step 4—Create a Demolitions layer (DEMOLITION) or (DEMO) that will represent the demolition or items to be removed during construction activities in the Interim Parent File and set to a color, for example magenta, that will be specific for items to be removed. Also, create a layer (CORRECTIVES) that will represent existing conditions that require drawing correctives for content or location in the Interim Parent File and set to a color that will be specific for items to be relocated or corrected. This layer may need to be used when moving or making correctives to existing condition items in the Design File as described in Alternative Workflow For Moving or Deleting Existing Items beginning at Step 7 (if required). In an embodiment, the Linetype is CONTINUOUS, BYLAYER. Exemplary working files or file names include:

D-PARENT FILENAME-PN#####.DWG—Internal

D-PARENT FILENAME-C#####.DWG—External

Figure 6:
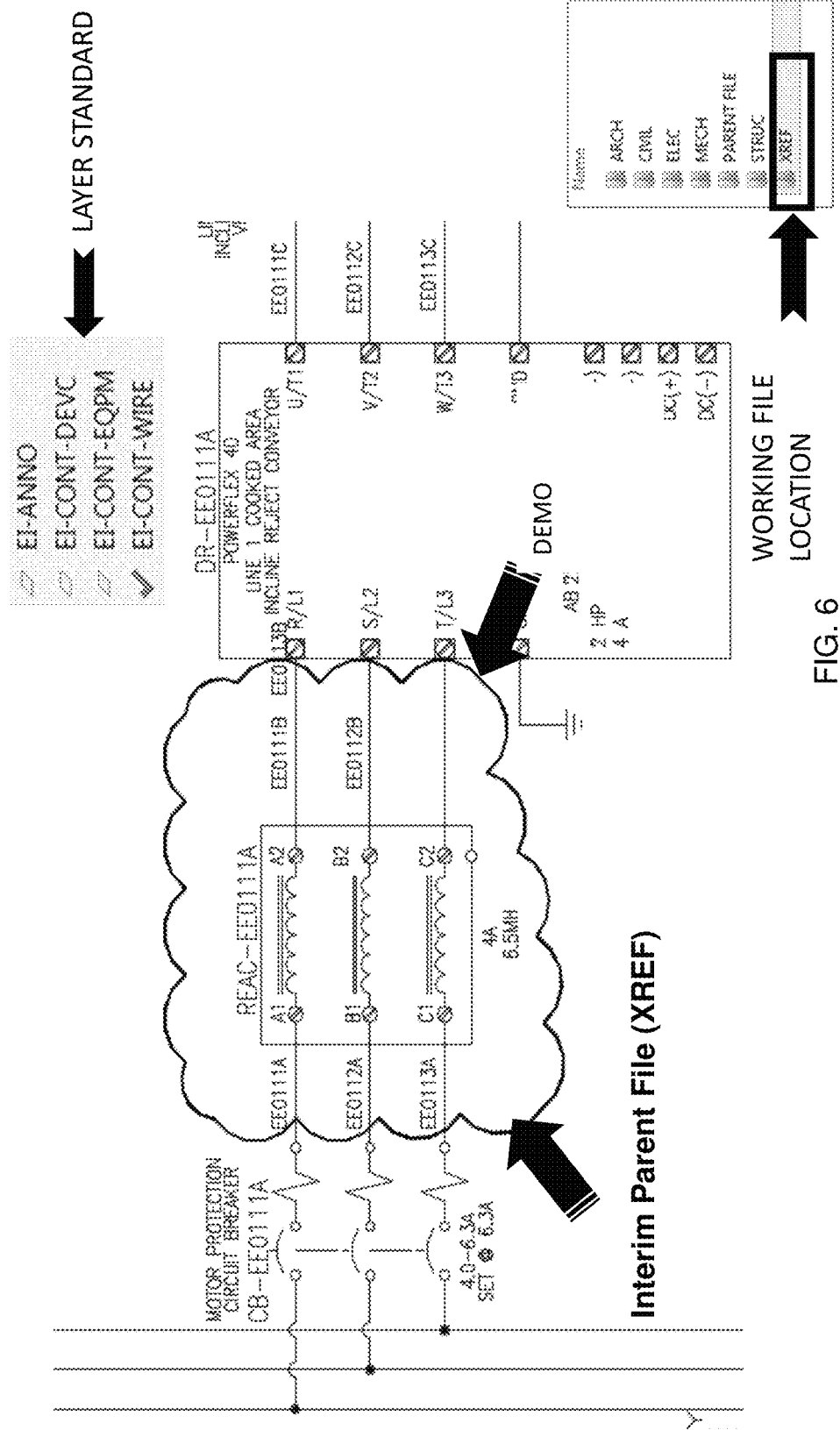

FIG. 6 shows a detailed screenshot view of performing a Step 5—Change demolition objects (objects to be removed during construction activities) to the DEMOLITION layer within the Interim Parent File. The demolition objects are the items to be removed during the construction of the new design. Exemplary working files or file names include:

D-PARENT FILENAME-PN#####.DWG—Internal

D-PARENT FILENAME-C#####.DWG—External

Figure 7:
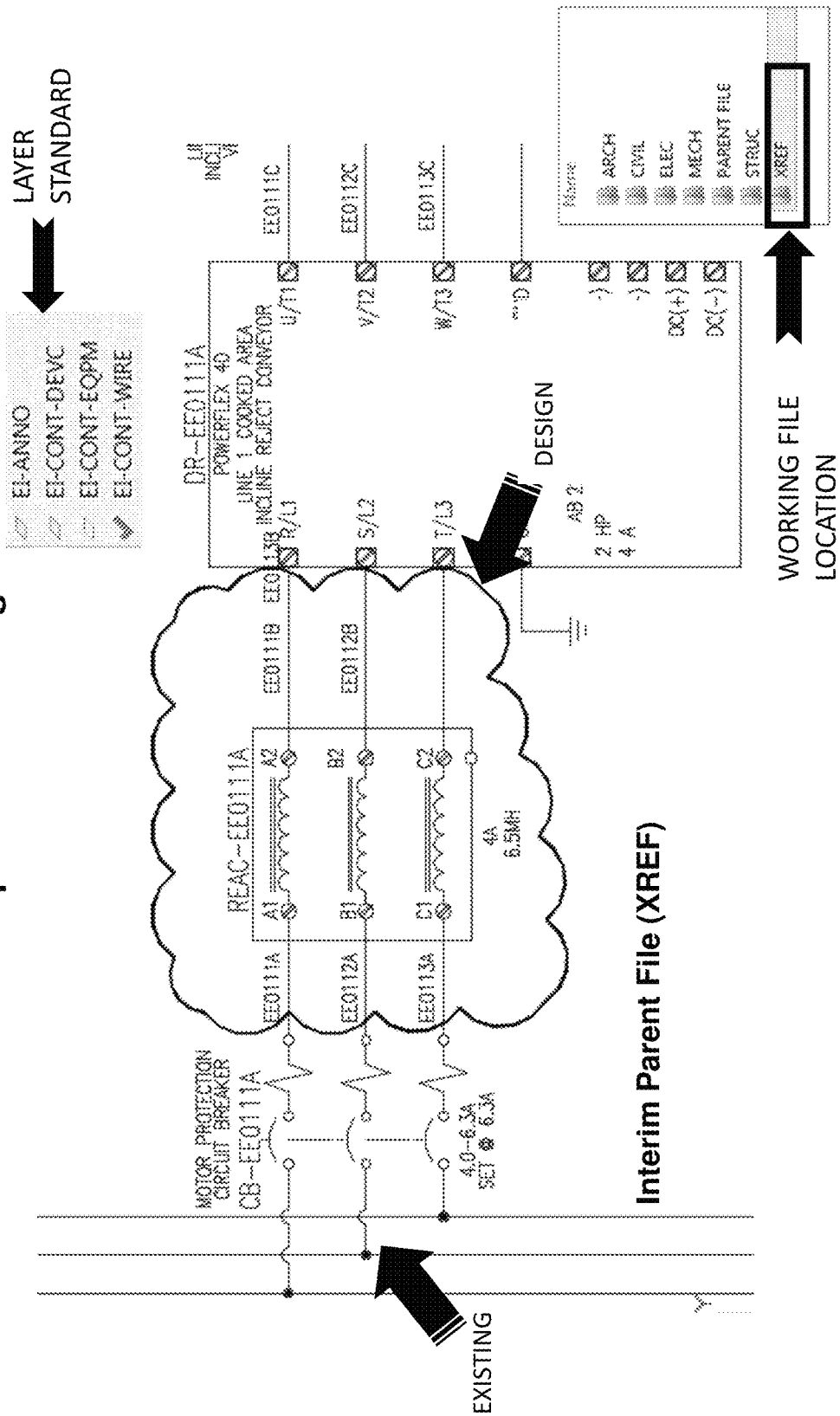

FIG. 7 shows a detailed screenshot view of performing a Step 6—Create a new Design File with a prefix, for example in this process it could be X—followed by the original Interim Parent File drawing name and a suffix that allows for a Unique Project Identifier Number. This Unique Identifier will allow the organization to discern that an edit (items to be added) to an existing Record Drawing File will be required in the O&M Record Drawing File Conformance Process and also prevent overwrite of data by concurrent changes occurring to the same Record Drawing File.

This new design will be referred to as the Design XREF File throughout the rest of this process. Within the Design XREF File, externally referenced in the Interim Parent File (using the overlay method) making sure that the origins of both CADD drawing files are in the same location. FREEZE or Turn OFF the DEMOLITION layer and the CORRECTIVES layer. In an embodiment, this file is saved in a separate directory designated for XREF Files used for file compositions in the Demolition and Design Construction Sheet Files. In an embodiment, all other layers in the Interim Parent File are grayscaled, and all new items to be added during the construction project are placed on the appropriate discipline specific layers. Note: All layer names used in the Record, Interim Parent, and the Design XREF File should be exactly the same in naming convention with the entity properties set to by-layer. This removes the need for additional manual manipulation of data during the Record Conformance Process, in an embodiment. Exemplary working files or file names include:

X-PARENT FILENAME-PN#####.DWG—Internal
X-PARENT FILENAME-CN####.DWG—External

Figure 8:
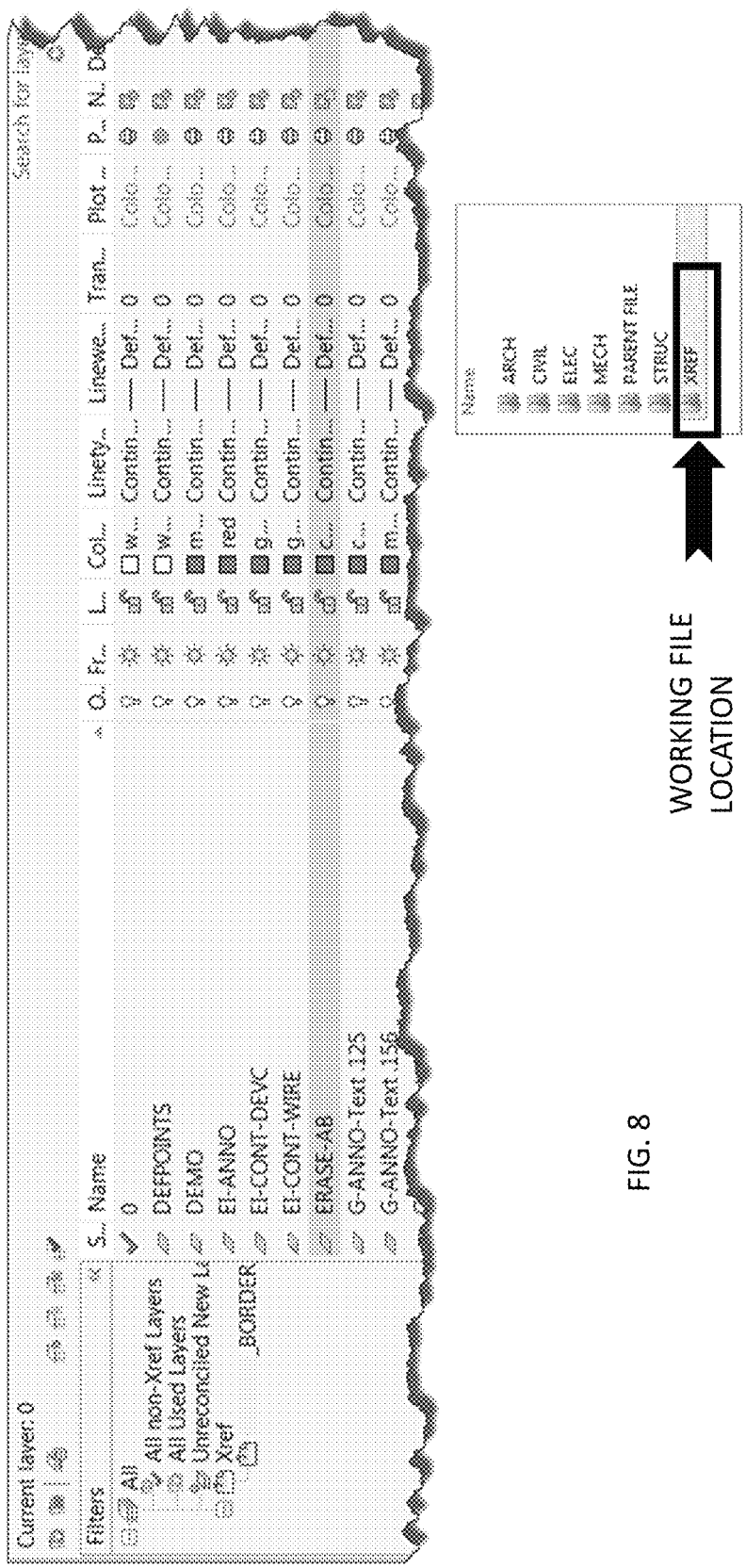

In an embodiment, exemplary actions performed in or details of Step 6 include:

Create a new drawing file with the O&M standard drawing template file
Save it in the in PROJECT-XREF FOLDER as X-PARENT FILENAME-PN#####.dwg or X-PARENT FILENAME-CN####.dwg
Externally Reference in the D-PARENT FILENAME-PN#####.dwg or D-PARENT FILENAME-CN####.dwg (0,0) overlay, layer xref
Freeze DEMOLITION and CORRECTIVE (optional workflow-step 7 if required) layers and gray scale all layers to color 252
Place all items to be added during construction on the appropriate EI-* LAYERS (or discipline specific National CADD standards or operations and maintenance CADD standards).
ALL LAYER NAMES USED IN ALL FILES MUST BE EXACTLY THE SAME (with exception to the DEMO and CORRECTIVE layers—as they only appear in the D-PARENT FILENAME-C/OR WO#####.DWG). Border and revision block shall remain in paperspace FIG. 8 shows a detailed screenshot view of performing a Step 7—creating a CORRECTIVES layer ERASE-AB (if required) in the Interim Parent File (XREF). In an embodiment, this is an alternative workflow for moving or deleting existing items. In some embodiments, the color of the ERASE-AB layer is cyan and uses Linetype CONTINUOUS, BYLAYER. Exemplary working files or file names include:

D-PARENT FILENAME-PN#####. DWG—INTERNAL
D-PARENT FILENAME-C#####.DWG—EXTERNAL

Figure 9:
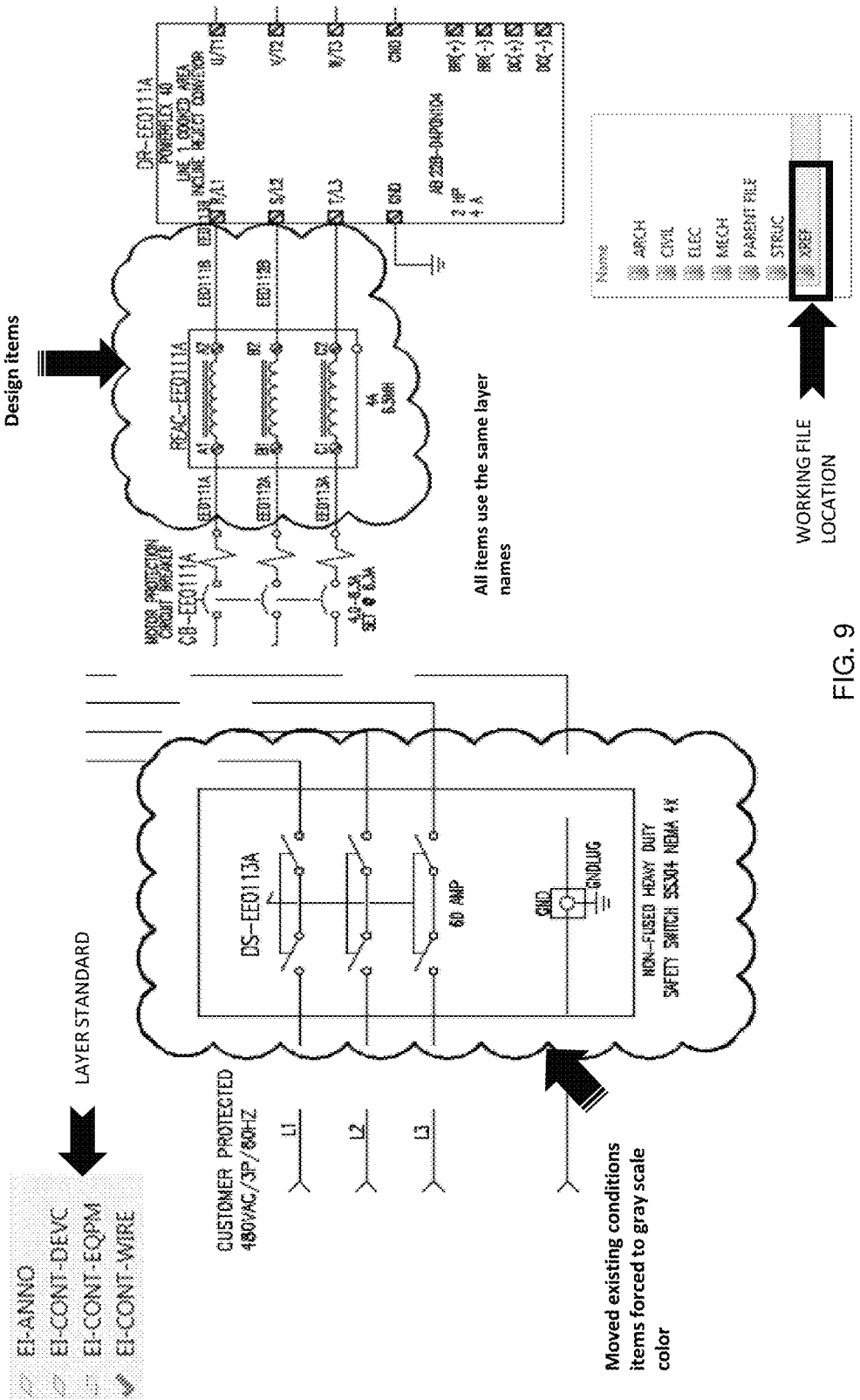

FIG. 9 shows a detailed screenshot view of performing a Step 7a—Alternative Workflow For Correcting Existing Items. In the Interim Parent File, select the items to be corrected—(existing condition items that need to be moved to a new location in the drawing) and perform the following functions. In an embodiment, this is an alternative workflow for correcting existing items. Exemplary working files or file names include:

X-PARENT FILENAME-PN#####. DWG—INTERNAL
X-PARENT FILENAME-C#####.DWG—EXTERNAL
In the DESIGN XREF FILE
COPYBASE 0,0 (items to be moved) from the Interim Parent File into the Design XREF File (D-PARENT FILENAME-PN#####.dwg or D-PARENT FILENAME-CN####.dwg), retaining the existing Interim Parent File Layers and/or Interim Parent File layer names.
In the Design XREF File (X-PARENT FILENAME-PN#####.dwg or X-PARENT FILENAME-CN####.dwg) force the colors of the items copied from the Interim Parent File to 252, and move the entities to the desired corrective location.

Figure 10:
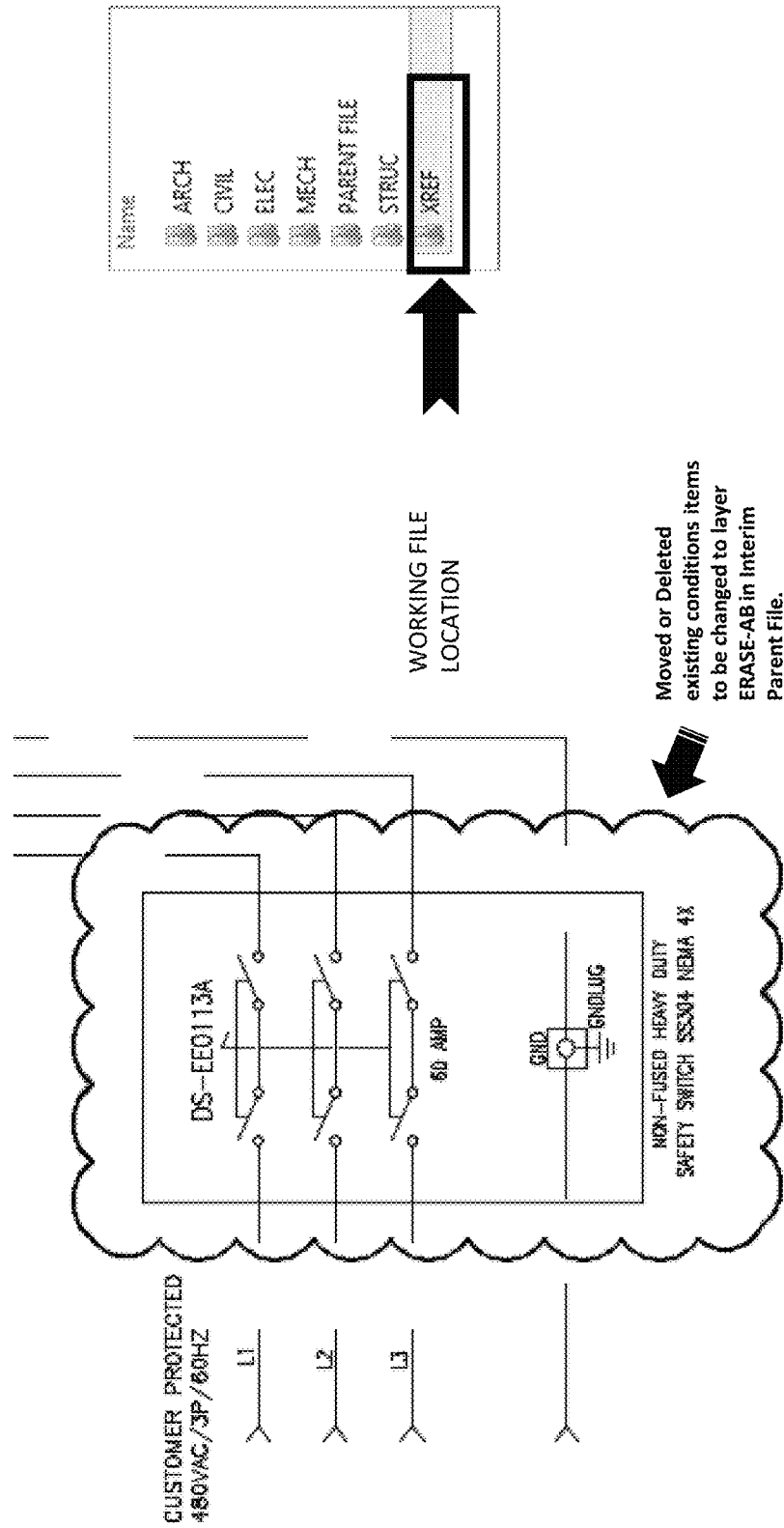

FIG. 10 shows a detailed screenshot view of performing a Step 7b—Alternative Workflow For Moving or Deleting Existing Items. Change Objects from the Interim Parent File that have been selected to meet the following criteria: Objects do not exist in the field, or objects are being corrected in the Design XREF File to show current location in the field), to the CORRECTIVES layer (if required). It should be noted that the CORRECTIVES layer will be ON in the Demolition Sheet File (see Step 8), unless the CORRECTIVES Layer will be used for removal of existing conditions that do not exist in the field. If this is the case the CORRECTIVES Layer will be FROZEN in the Demolition Construction Sheet File (see Step 8). The CORRECTIVES Layer in the Interim Parent File will also be FROZEN in the Design Sheet File (see Step 9). Exemplary working files or file names include:

D-PARENT FILENAME-PN#####. DWG—INTERNAL
D-PARENT FILENAME-C#####.DWG—EXTERNAL

Figure 11:
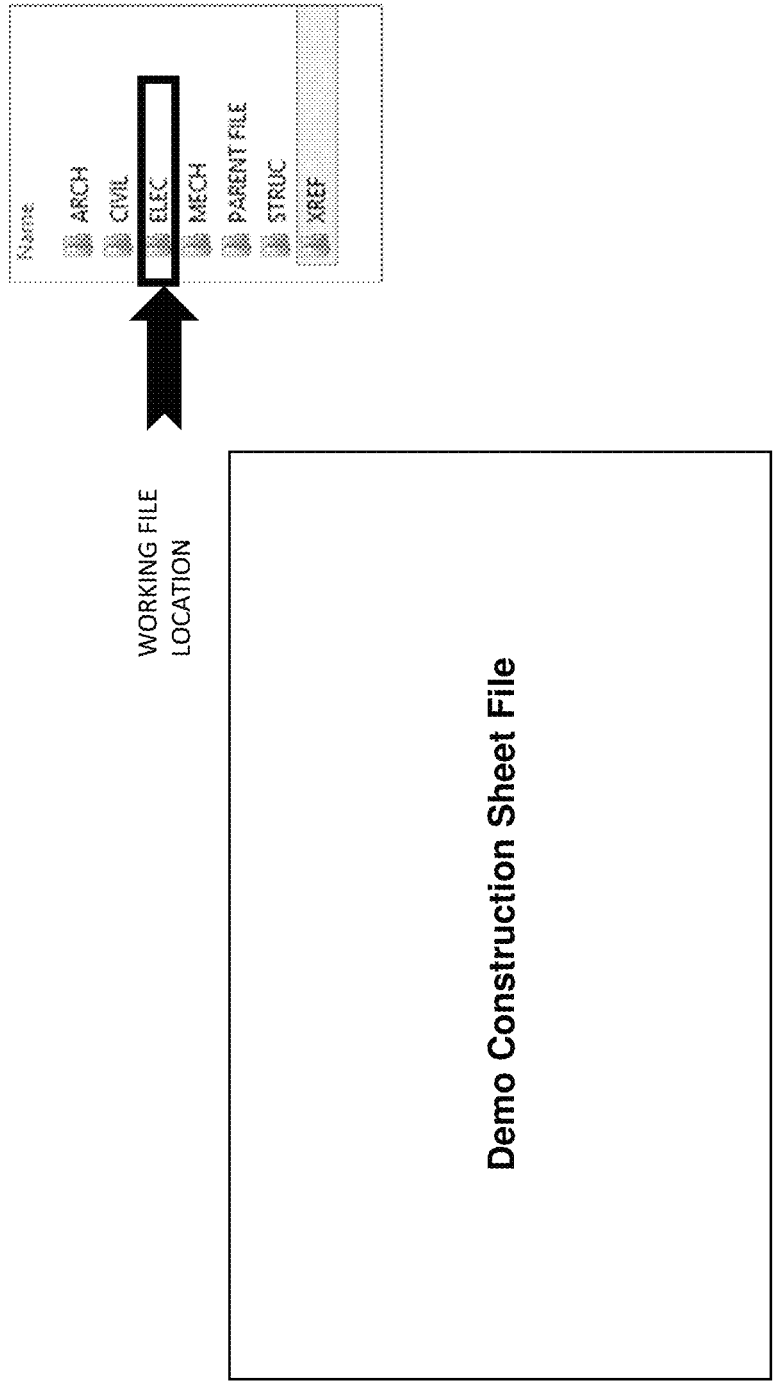

Exemplary actions performed in or details of Step 7b, include:

In the INTERIM PARENT FILE
Once items to be moved are copied into the X-PARENT FILENAME-PN#####.dwg or X-PARENT FILENAME-CN####.dwg change the items previously selected to layer ERASE-AB in the D-PARENT FILENAME-PN#####.dwg or D-PARENT FILENAME-CN####.dwg
Note: This layer will be ON in the DEMO CONSTRUCTION SHEET FILE (unless used for removal of existing conditions that do not exist in the field—then this condition will be FROZEN) This layer will be FROZEN in the DESIGN CONSTRUCTION SHEET FILE FIG. 11 shows a detailed screenshot view of performing a Step 8—Create a new Demolition Construction Sheet File and externally reference in the Interim Parent File and grayscale all layers except the DEMOLITION layer, and FREEZE the CORRECTIVES layer (if it is being used to remove an existing condition). Place all key notes/Demolition notes and call out leaders on the appropriate layers in paper space. Optionally, save this file in a separate directory designated for Construction Documents to be plotted and distributed for construction activities. Exemplary working files or file names include:

PARENT FILENAME-WO#####-D.DWG—INTERNAL
PARENT FILENAME-C####-D.DWG—EXTERNAL

Exemplary actions performed in or details of Step 8, include:

Create a new drawing file with the O&M Organization's standard drawing template
Save it in the in PROJECT DISCIPLINE folder as PARENT FILENAME-WO#####-D.DWG—Internal or PARENT FILENAME-CN####-D.DWG—External
Externally Reference in the D-PARENT FILENAME-PN#####.Dwg or D-PARENT FILENAME-CN####.Dwg (0,0) overlay, layer XREF, from the XREF folder
Grayscale all D-PARENT FILENAME-PN#####.Dwg or D-PARENT FILENAME-CN####.Dwg layers to color 252 except DEMO layer, FREEZE, ERASE-AB layer (if it is used to remove an existing condition)
Place all key notes/demolition notes, revision clouds and call out leaders on the appropriate G-* LAYER in paperspace
Cloud demo in paperspace
Complete border information and revision block (Schema per O&M CADD Standards)

Figure 12:
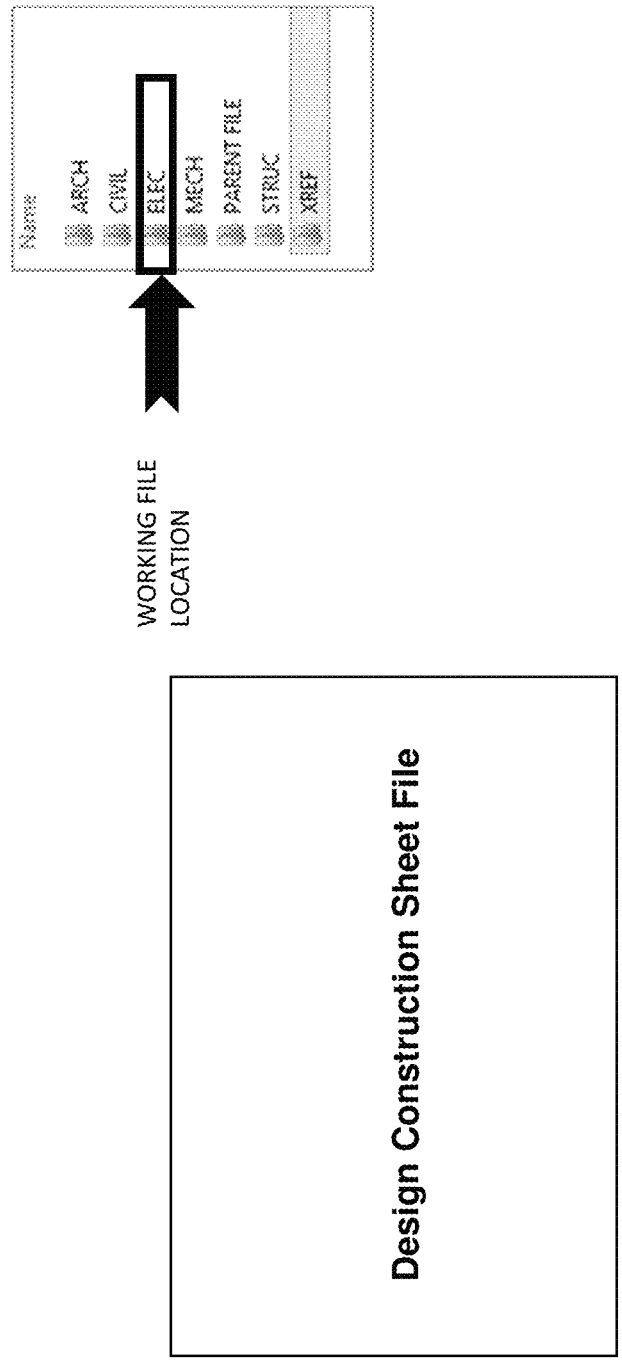

FIG. 12 shows a detailed screenshot view of performing a Step 9—Create a new Design Construction Sheet File and externally reference in the Interim Parent File and grayscale all of the Interim Parent File layers, FREEZE the DEMO- LITION layer, and FREEZE the CORRECTIVES layer. Externally reference in the Design XREF File, and place all key notes/construction notes and call out leaders on the appropriate layers in paper space. Exemplary working files or file names include:

PARENT FILENAME-PN#####.DWG—Internal
    PARENT FILENAME-CN####.DWG—External

Exemplary actions performed in or details of Step 9, include:

- Create a new drawing file with the O&M Organizations standard drawing template
- Save it in the in PROJECT DISCIPLINE folder as PARENT FILENAME-PN#####.DWG or PARENT FILENAME-CN####.DWG
- Externally Reference in the D-PARENT FILENAME-PN#####.DWG or D-PARENT FILENAME-CN####.DWG (0,0) overlay, layer XREF, from the XREF folder
- Externally Reference in the X-PARENT FILENAME-PN#####.DWG or X-PARENT FILENAME-CN####.DWG (0,0) overlay, layer XREF, from the XREF folder
- Freeze DEMO and ERASE-AB LAYER(S) and gray scale all D-PARENT FILENAME-PN#####.DWG or D-PARENT FILENAME-CN####.DWG layers to color 252
- Place all key notes/construction notes, revision clouds and call out leaders on the appropriate G-* LAYER in paperspace
- Cloud additions in paperspace
- Complete border information and revision block (Schema per O&M CADD Standards)

Figure 13:
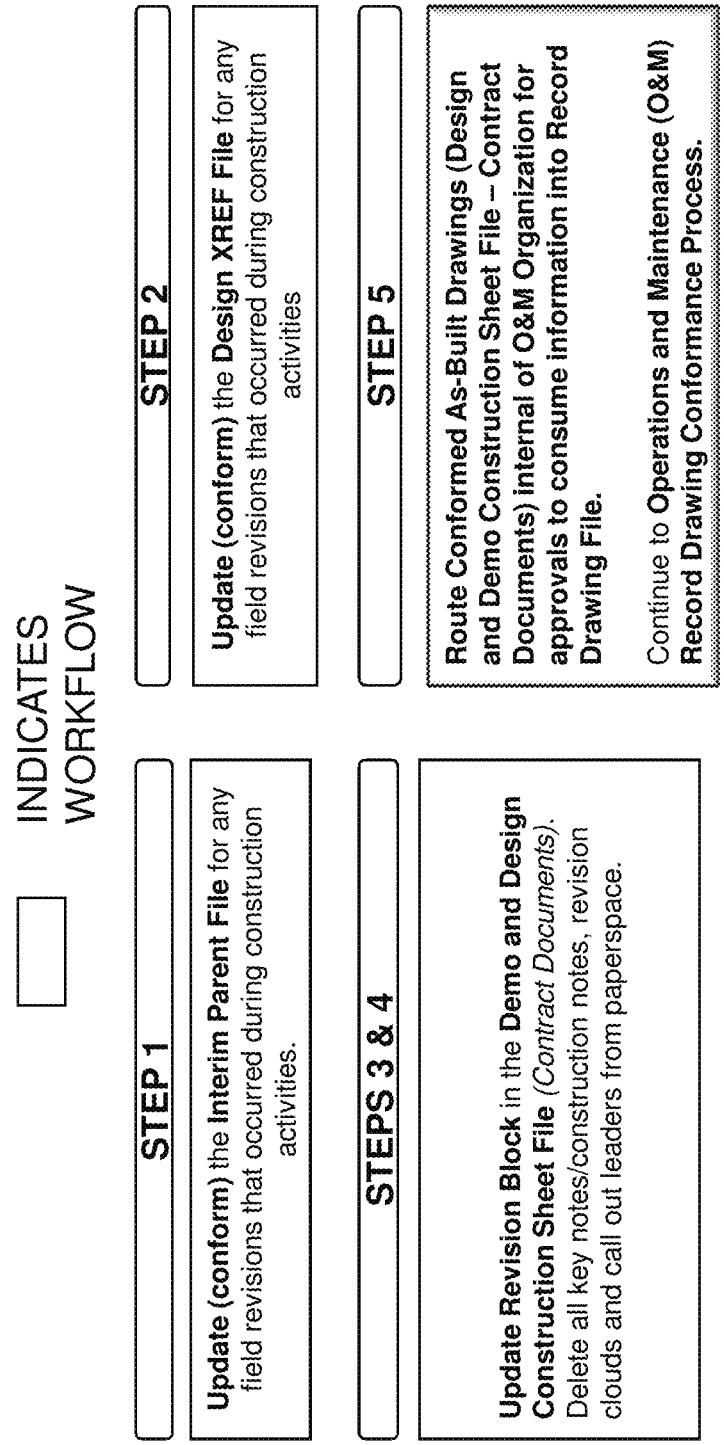
FIG. 13 is a flowchart showing an exemplary Operations and Maintenance As-Built Drawing Conformance Process, in an aspect.

FIG. 13 is a flowchart showing an exemplary O&M As-Built Drawing Conformance Process for protecting the integrity of dynamically modified files, in an aspect. Exemplary actions taken are described in more detail with respect to FIGS. 14-18, below.

Figure 14:
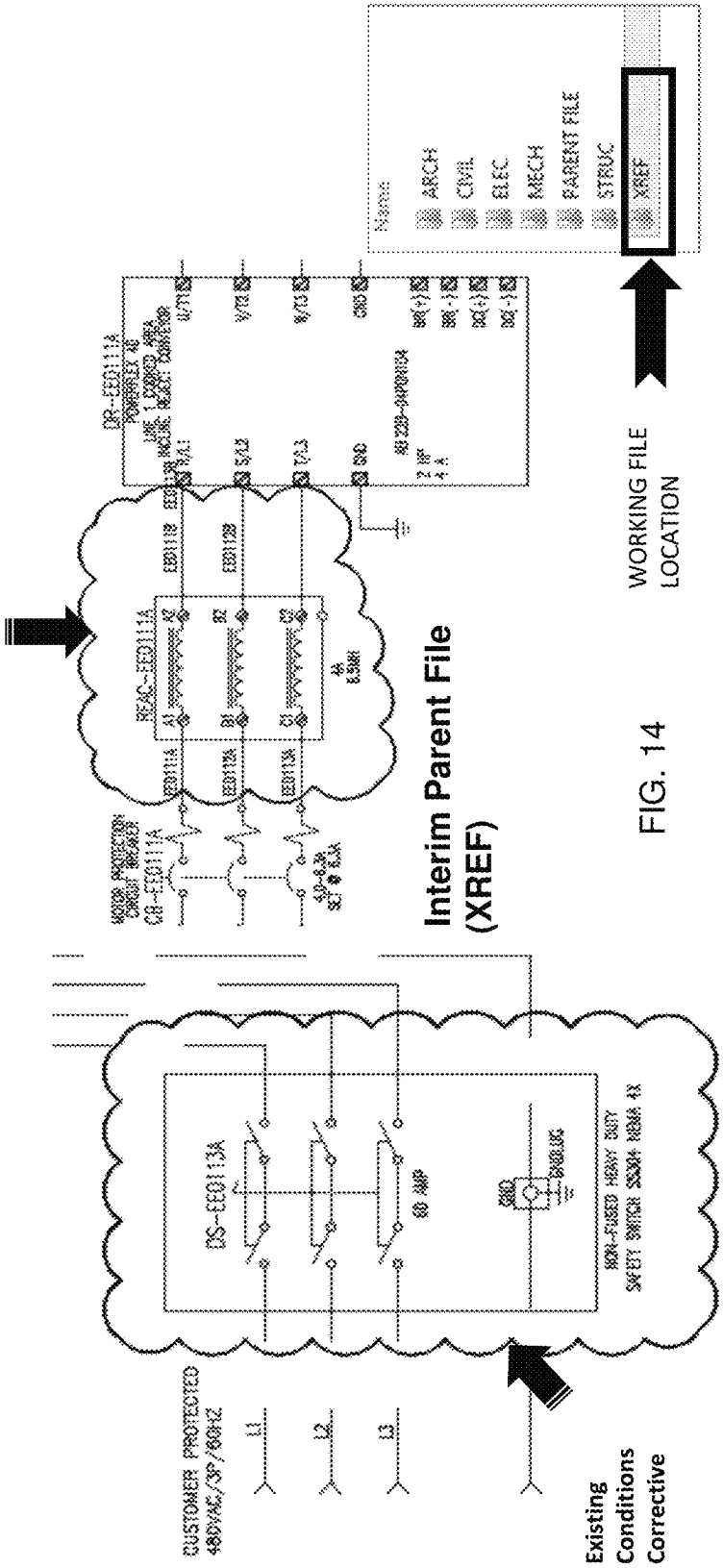
FIGS. 14-18 show exemplary and/or alternative actions performable with an Operations and Maintenance As-Built Drawing Conformance Process, in an aspect.

FIG. 14 shows a detailed screenshot view of performing a Step 1—Update (conform) the Interim Parent File. Make necessary revisions to the Interim Parent File if necessary for any field revisions that occurred during construction activities. (Do not rename these files).

Figure 15:
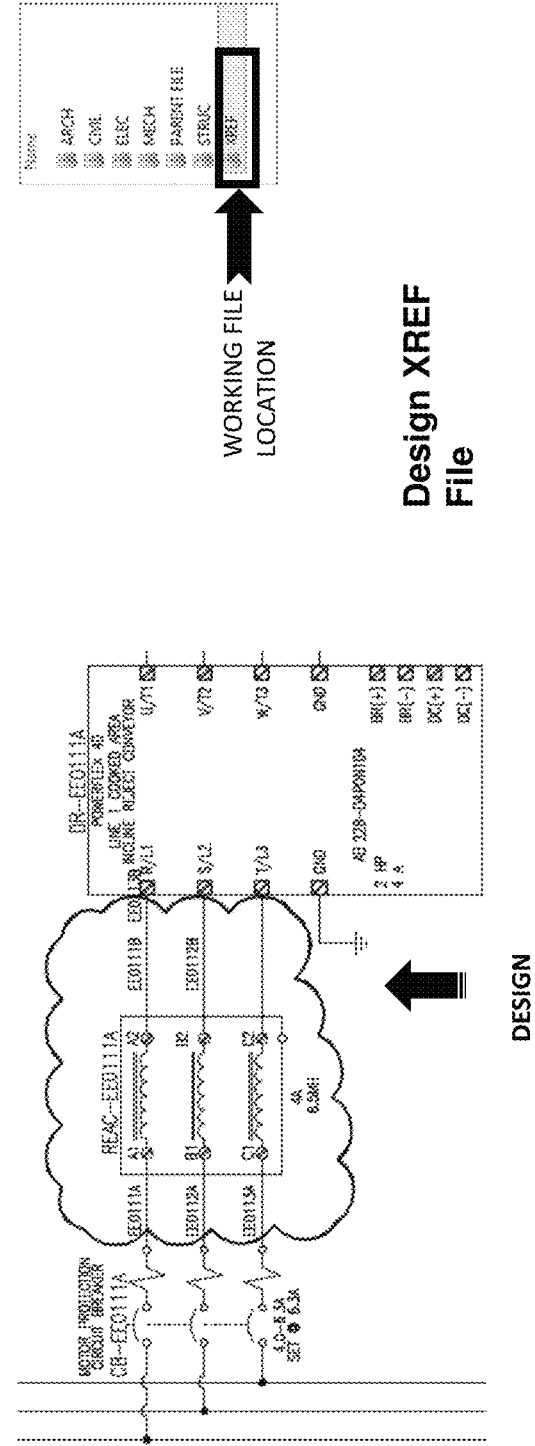

FIG. 15 shows a detailed screenshot view of performing a Step 2—Update (conform) the Design XREF File. Make necessary revisions to the Design XREF File if necessary for any field revisions that occurred during construction activities. (Do not rename these files).

Figure 16:
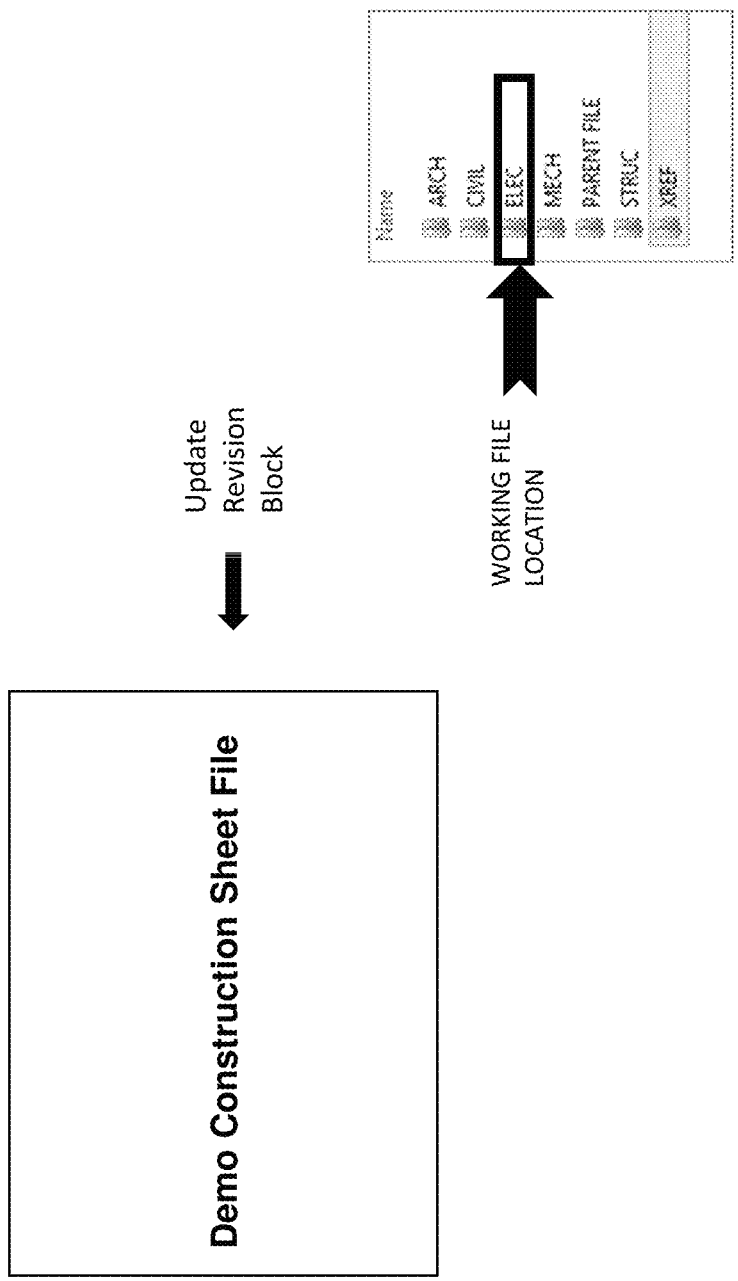

FIG. 16 shows a detailed screenshot view of performing a Step 3—Update Revision Block in the DEMOLITION Construction Sheet File (Contract Document). Delete all key notes/Demolition notes and call out leaders from paper space. Once the Demolition Construction Sheet File (Contract Document) is approved continue to the O&M Record Drawing Conformance Process. Exemplary working files or file names include:

PARENT FILENAME-WO#####-D.DWG—INTERNAL
    PARENT FILENAME-C####-D.DWG—EXTERNAL

Figure 17:
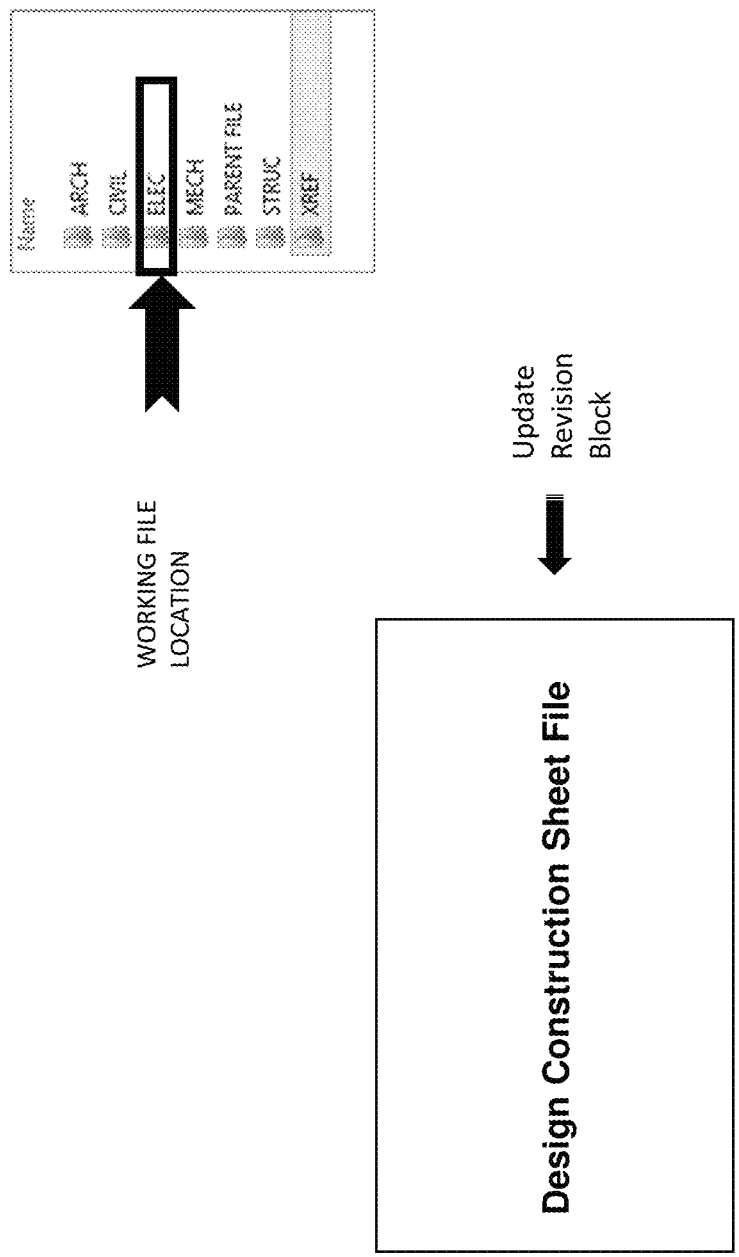

Exemplary actions performed in or details of Step 3, include:

- Update revision block +1 revision bump, AS-BUILT Description per O&M CADD Standards
- All key notes/construction notes, revision clouds and call out leaders have been removed from paperspace
- Plot for routing and approvals FIG. 17 shows a detailed screenshot view of performing a Step 4—Update Revision Block in the Design Construction Sheet File (Contract Document). Delete all key notes/construction notes and call out leaders from paper space. Exemplary working files or file names include:

PARENT FILENAME-PN#####. DWG—INTERNAL
    PARENT FILENAME-CN####.DWG—EXTERNAL

Figure 18:
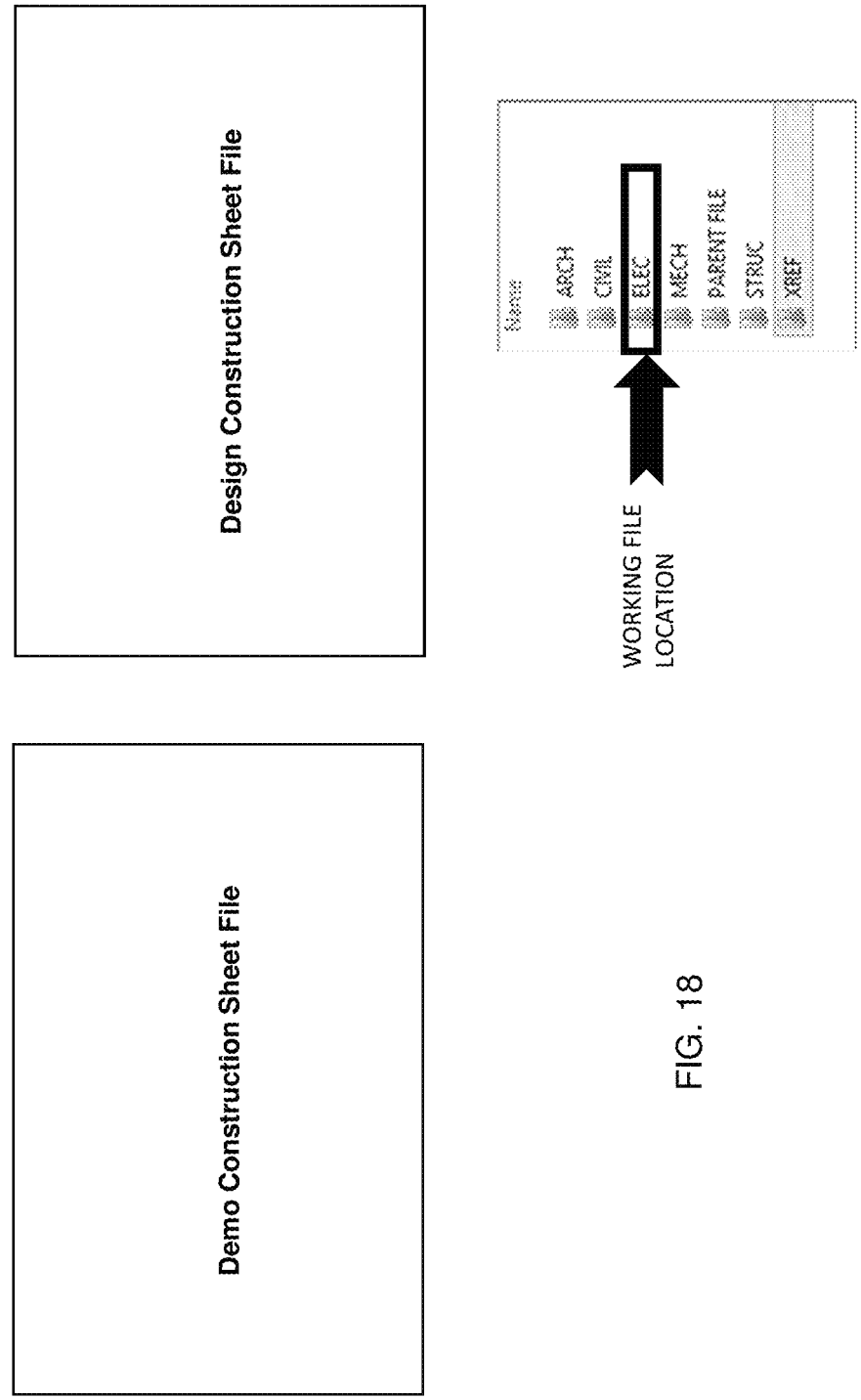

Exemplary actions performed in or details of Step 4, include:

- Update revision block +1 revision bump, AS-BUILT Description per O&M CADD Standards
- All key notes/construction notes, revision clouds and call out leaders have been removed from paperspace
- Plot for routing and approvals FIG. 18 shows a detailed screenshot view of performing a Step 5—Route Conformed As-Built Drawings (Design Construction Sheet File—Conformed Contract Document) internal of the O&M Organization for approvals to consume this information into the Record Drawing File. Once the Design Construction Sheet File (Conformed Contract Document) is approved, continue to the O&M Record Drawing Conformance Process. Exemplary working files or file names include:

PARENT FILENAME-PN#####.DWG—INTERNAL
    PARENT FILENAME-CN####.DWG—EXTERNAL

Figure 19:
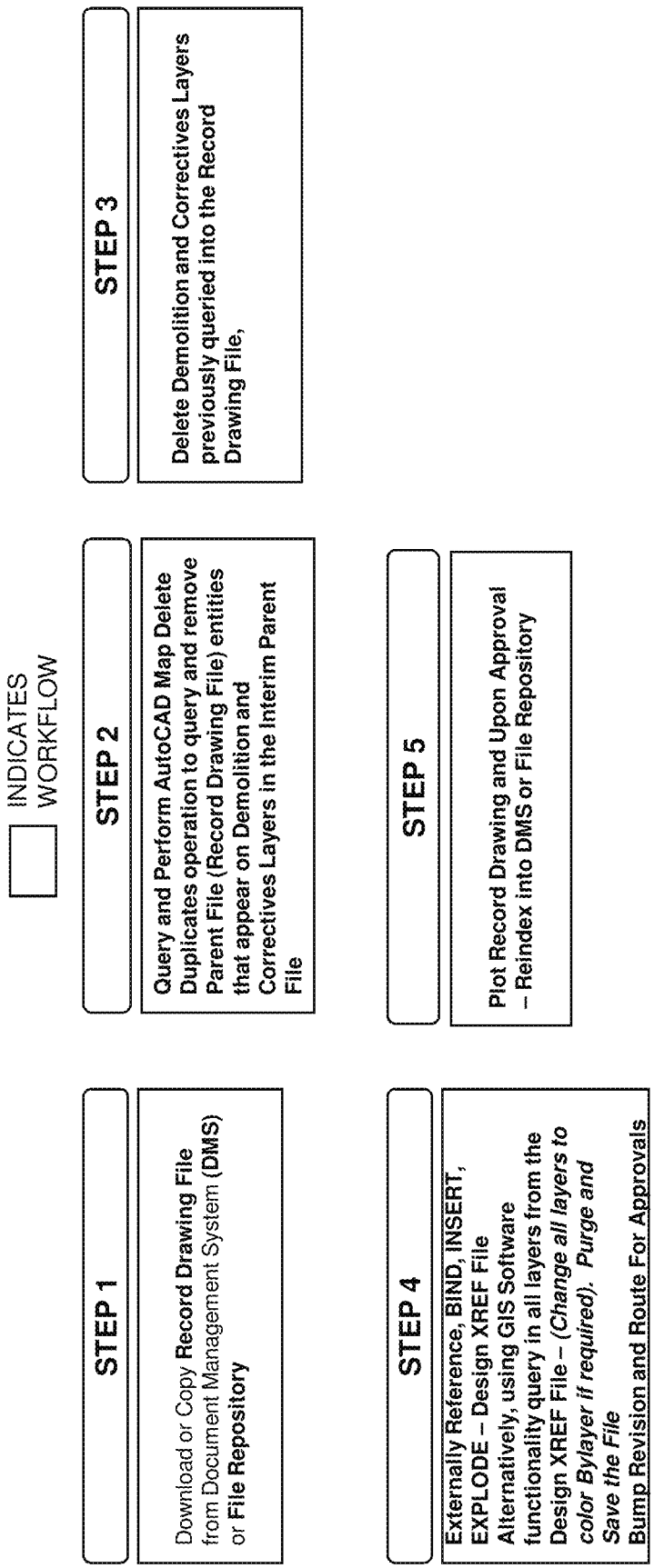
FIG. 19 is a flowchart showing an exemplary Operations and Maintenance Record Drawing Conformance Process, in an aspect.

Exemplary actions performed in or details of Step 5, include:

- Route conformed construction contract documents for approvals
- Once approved, continue to Operations and Maintenance Internal Record Drawing Conformance Process FIG. 19 is a flowchart showing an exemplary O&M Record Drawing Conformance Process for protecting the integrity of dynamically modified files, in an aspect. Exemplary actions taken are described in more detail with respect to FIGS. 20-22, below.

Figure 20:
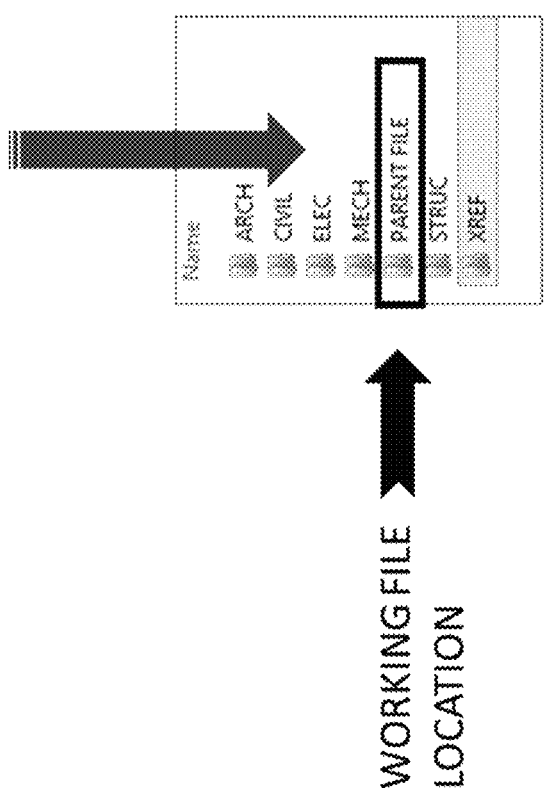
FIGS. 20-22 show exemplary and/or alternative actions performable with an Operations and Maintenance Record Drawing Conformance Process, in an aspect.
Figure 21:
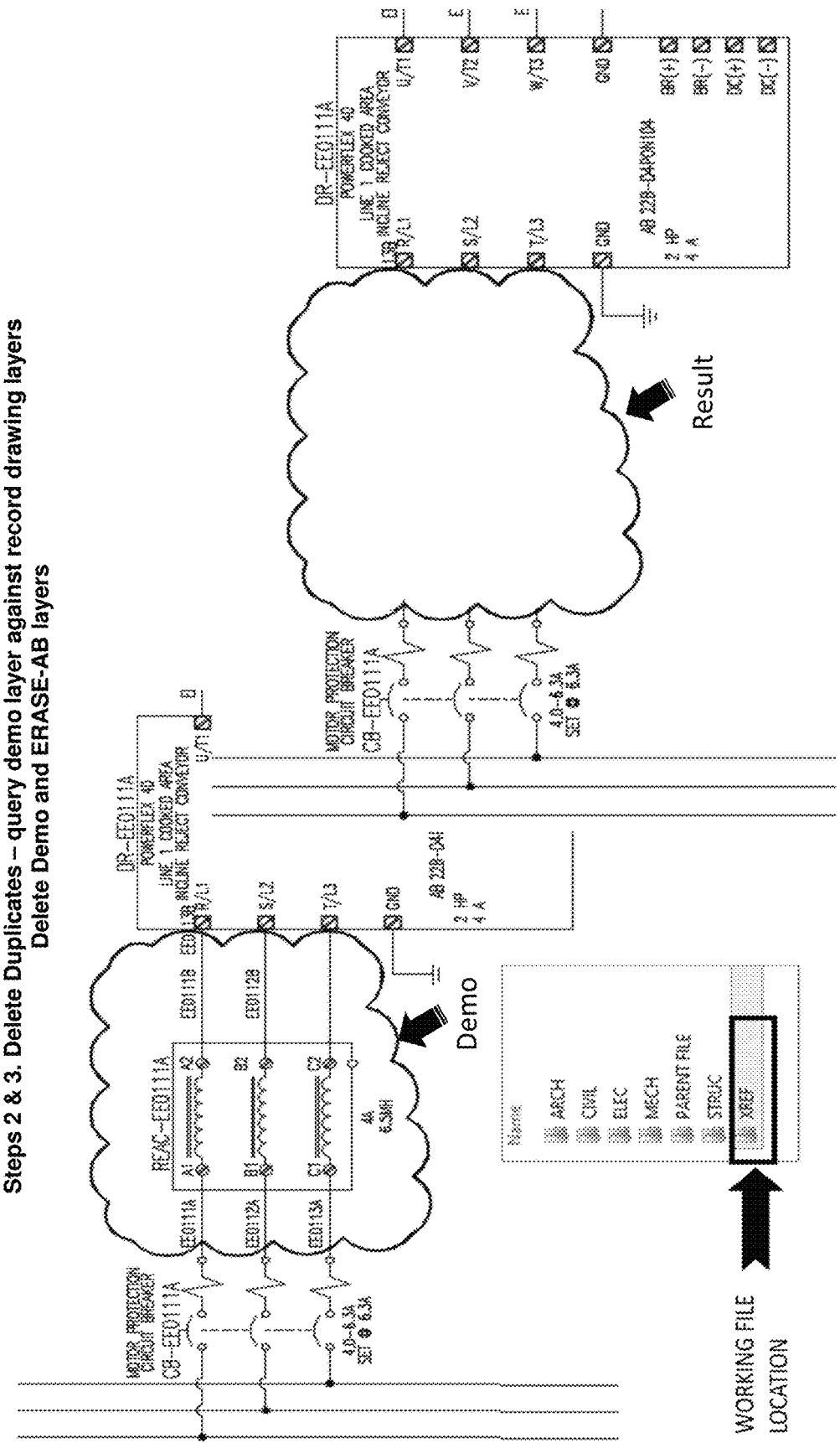

FIG. 20 shows a detailed screenshot view of performing a Step 1—Download or copy the Record Drawing File from a Document Management System (or file repository if applicable) to the working location. Project Design Files: Record Drawing File.dwg(s) (PARENT FILES) are downloaded from Document Management System or File Repository to the Project Parent File Folder FIG. 21 shows a detailed screenshot view of performing a Steps 2 and 3 as outline below.

Step 2—Perform AutoCAD Map Delete Duplicates operation to query and remove Parent File (Record Drawing File) entities that appear on the Demolition and Correctives Layers in the Interim Parent File.

- Open the Record Drawing File (Document Management System PARENT FILE—RECORD DRAWING FILE) in AUTOCAD MAP.
- Go To the Map Task Pane—Map Explorer Tab.
- Create Network or Local Drive File Location Alias where drawings are stored.
- Select Drawings→right click→select ATTACH.
- Navigate to the project XREF folder location and select the conformed Interim Parent File (D-PARENT FILENAME-C/WO#####.DWG)→then select ADD→then OK.
- Select CURRENT QUERY→DEFINE→LOCATION, ALL.
- Select Property→LAYER, DEMOLITION, CORRECTIVES/ERASE-AB (if required).
- Select Query Mode→PREVIEW and check for overlapping lines—use break line lisp routine (if required), dimensions and other items that may not be removed with this function.

Rerun Query→DRAW, then select EXECUTE QUERY (this results in the DEMOLITION and CORRECTIVES/ERASE-AB Layer(s) being added to the Record Drawing File/parent.)

DETACH the CADD drawing file (by selecting the file from the MAPVIEW PANE and performing a right click function).

XREF (attach) the corresponding Conformed File (X-PARENT FILENAME-C/WO#####.DWG) using an insertion point of 0,0 and OVERLAY as type.

Check for conflicts, errors and emissions—alert the responsible engineer of any discrepancies→then UNLOAD.

Type MAPCLEAN→select all objects to anchor in the DRAWING CLEANUP (*), →LAYER, DEMO, CORRECTIVES/ERASE-AB→then select next Select DELETE DUPLICATES—ADD, select ALL RADIO BUTTONS under the pick button listing→then select next Cleanup method should be MODIFY ORIGINAL OBJECTS→then select FINISH Check for leaders—use OVERKILL command type LYRMCUR, select existing parent file (Record CADD drawing file) item.

Step 3—Delete Demolition and Correctives Layers Previously queried into the Record Drawing File.

Type LAYDEL and select one item on the DEMOLITION (and if required) CORRECTIVES/ERASE-AB layer(s).

Result—(Demolition, remove and moved items on the existing Record Drawing File/parent layers have been deleted, DEMOLITION and CORRECTIVES/ERASE-AB Layer(s) removed.

Figure 22:
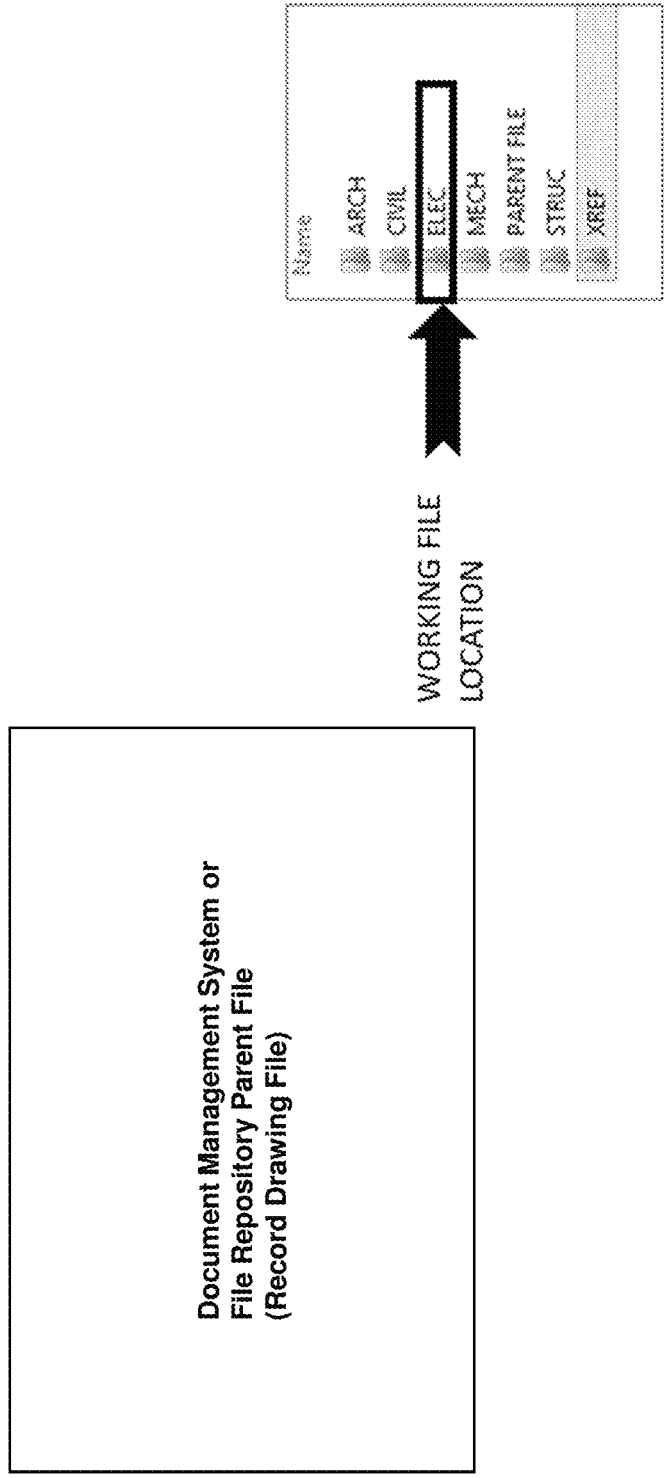

FIG. 22 shows a detailed screenshot view of performing a Steps 4 and 5 as outline below. Exemplary working files or file names include:

Document Management System PARENT FILE (RECORD DRAWING FILE)

Step 4—Bind Design XREF File into the Record Drawing.

RELOAD the Design XREF File.

Select the Design XREF File and right click→BIND→INSERT.

Select the Design XREF File (Block) and EXPLODE.

If Necessary, Select All Model Space Items and CHANGE PROPERTY→COLOR→BYLAYER (required if Alternate Workflow Step 7 is used).

Alternatively to using the prior four actions in FIG. 22, the end user may choose to use AutoCAD Map functions and attach the Design XREF file in the AutoCAD Map task pane to perform a query that will draw all the Design XREF File layers into the Record Drawing File and adjust all entity colors to BYLAYER with an alter property command executed during the AutoCAD Map query actions. Optionally, this alternative approach is automatically initiated by the computer programmed hardware.

PURGE and SAVE the file.

Update revision block +1 revision—RECORD Description per O&M CADD Standards

Plot Record Drawings and route for final approvals

Step 5—Plot Record Drawing and route for final approvals into the Record Drawing.

Upon approval—Reindex into Document Management System or File Repository

Figure 23:
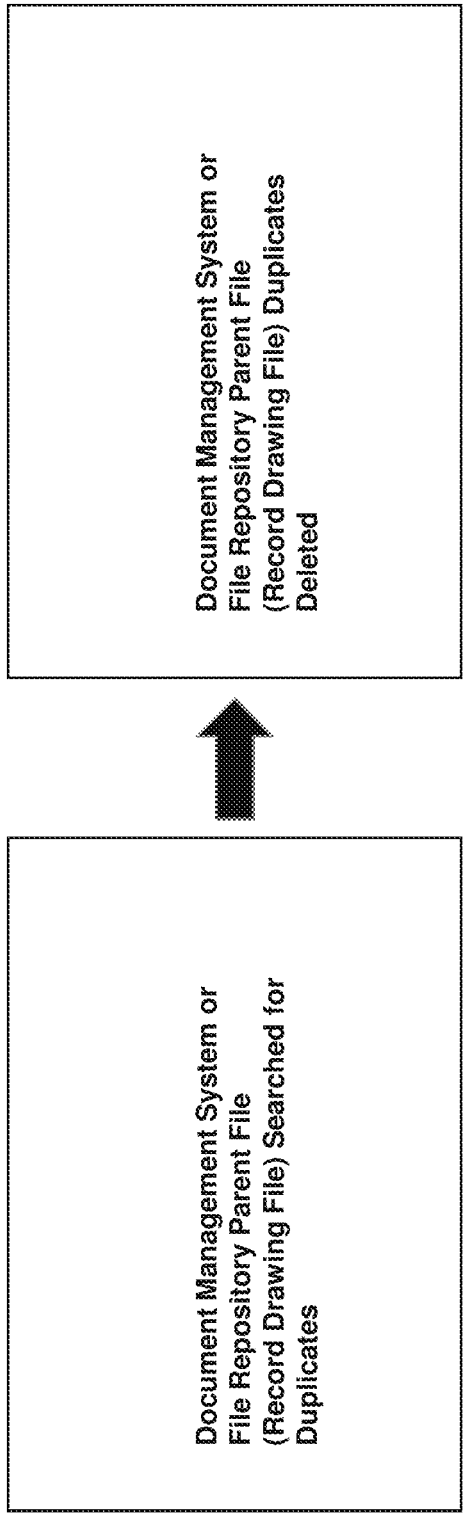
FIG. 23 is an Operations and Maintenance Record Drawing Conformance Process using a Custom Software Module, in an aspect.

FIG. 23 demonstrates a CADD Add-on software module, which functionally searches within the Record CADD Drawing File contents for duplicated CADD entities found in the Interim Parent File. When duplicated content is identified, the software module would then break duplicated line work within the Record CADD File when comparing overlapping entities from the Interim Parent File linework.

Wherever overlaps of duplicated CADD entities occur between the two compared files, the program's function would then mark and delete the Record CADD Drawing File's duplicated entities, regardless of layer names or drawing properties found—programmatically upon user review and acceptance. The planned functionality of this software module would execute command sequences outlined in the O&M Record Drawing Conformance Process that is demonstrated in the examples provided, and would not be reliant on the combination of AutoCAD Map and manual user command entries.

Furthermore, this module will allow the ability for the end users to control "anchor layers" (user specified layers selected from a comparison file) to be used for review and then consumed from an external file (in this example, the Interim Parent File) when reviewing and removing duplicated entities from the Record CADD Drawing File. In addition, software module would allow the end user to continue with an additional query of the Conformed Design Xref information and programmatically incorporate and adjust all layers into the Record CADD Drawing File to color BYLAYER.

Figure 24:
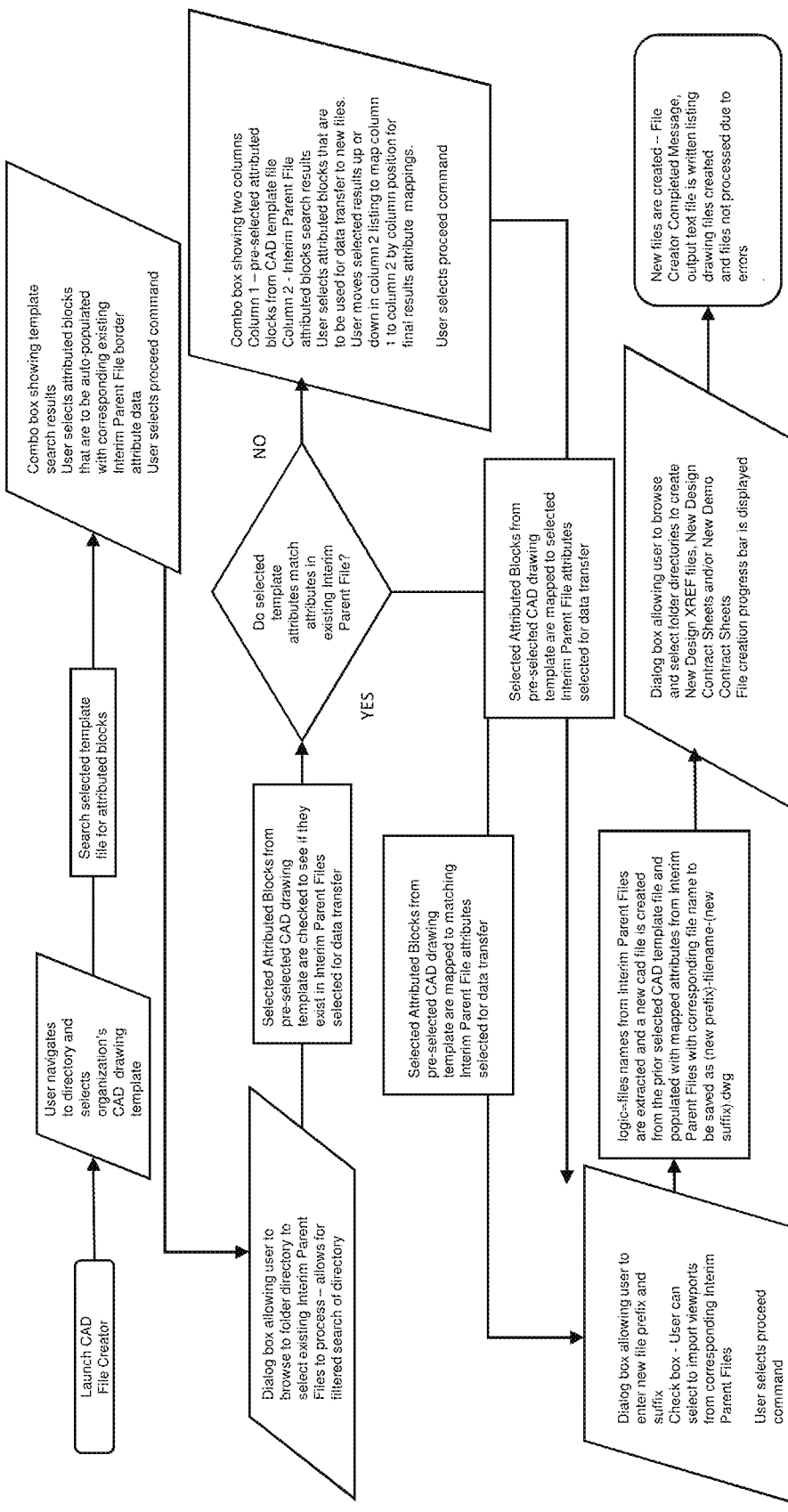
FIG. 24 is a flowchart of the operation of an automated CAD file creation software module, in an aspect; and, FIG. 25 is a flowchart of the operation of an automated XREF CAD file attachment software module, in an aspect.
Figure 24A:
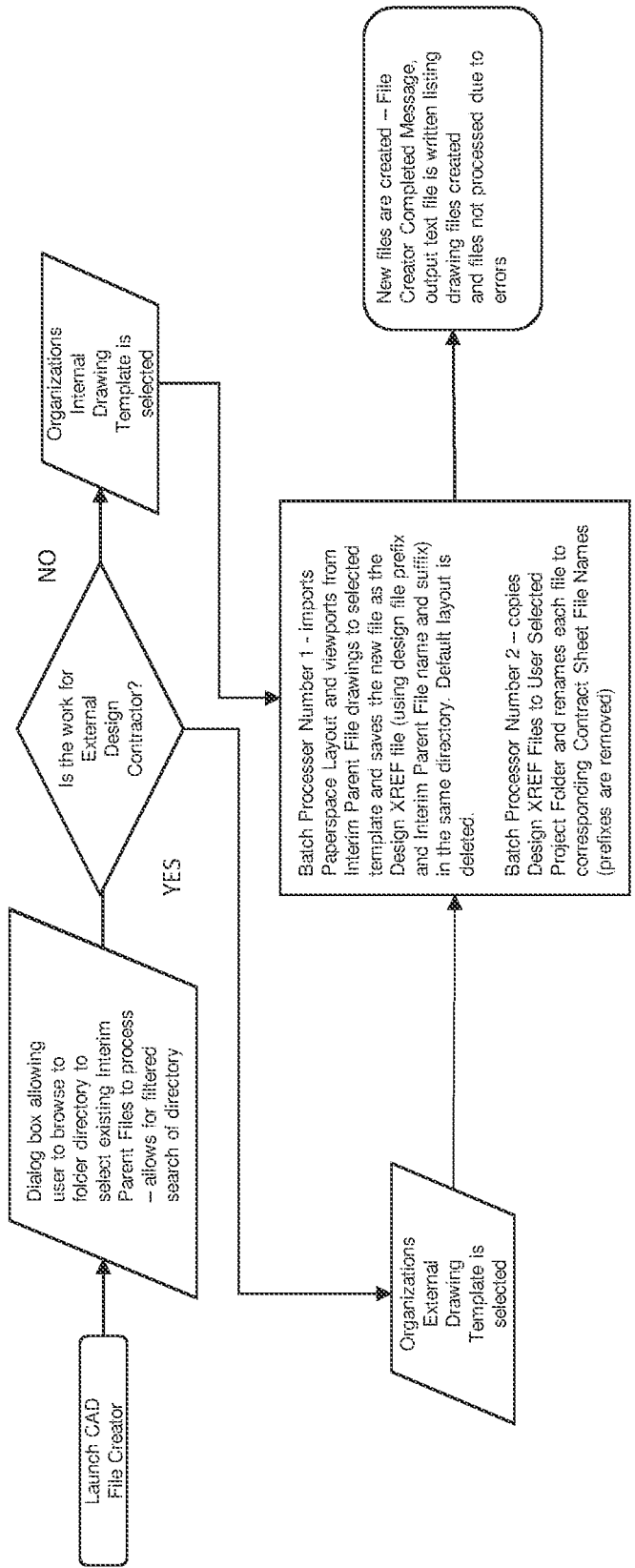

FIG. 24 is a flowchart of the operation of an automated CAD file creation software module, in an aspect. It should be understood that this process, and other processes described herein, do not have to be carried out in this particular order and do not require all of these steps. In fact, other steps could be incorporated into the process shown in FIG. 24 and/or one or more steps could be omitted, such as shown in FIG. 24A.

Step 1—Launch CAD File Creator

Step 2—User navigates to directory and selects organization's CAD drawing template Step 3—Search selected template file for attributed blocks Step 4—Combo box showing template search results.
  a) User selects attributed blocks that are to be auto-populated with corresponding existing Interim Parent File border attribute data.
  b) User selects proceed command Step 5—Dialog box allowing user to browse to folder directory to select existing Interim Parent Files to process—allows for filtered search of directory Step 6—Selected Attributed Blocks from pre-selected CAD drawing template are checked to see if they exist in Interim Parent Files selected for data transfer Step 7—Do selected template attributes match attributes in existing Interim Parent File?

Figure 25:
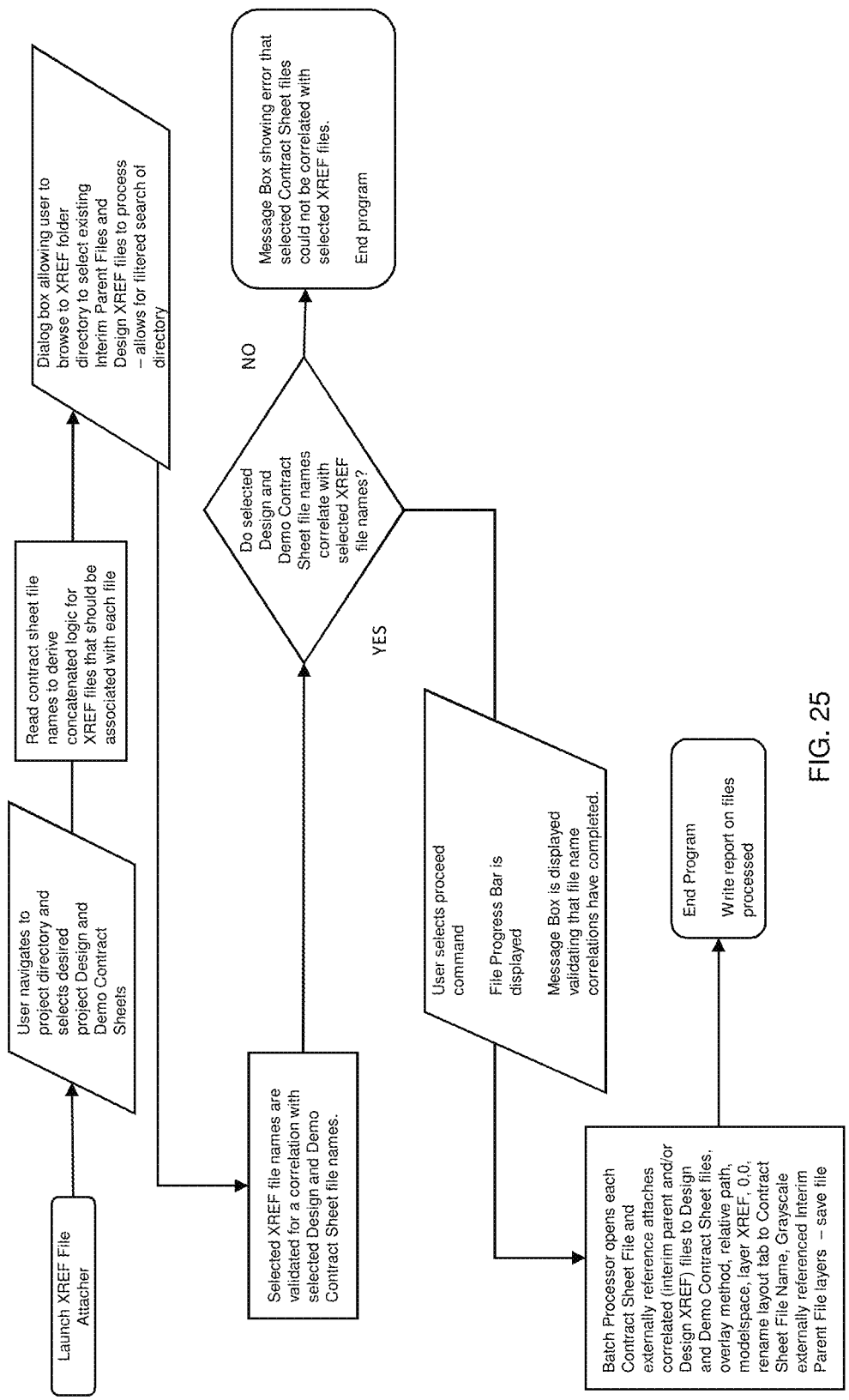

Step 8—Selected Attributed Blocks from pre-selected CAD drawing template are mapped to matching Interim Parent File attributes selected for data transfer Step 9—Combo box showing two columns:
  Column 1—pre-selected attributed blocks from CAD template file
  Column 2—Interim Parent File attributed blocks search results
  a) User selects attributed blocks that are to be used for data transfer to new files.
  b) User moves selected results up or down in column 2 listing to map column 1 to column 2 by column position for final results attribute mappings.
  c) User selects proceed command Step 10—Selected attributed blocks from pre-selected CAD drawing template are mapped to selected Interim Parent File attributes selected for data transfer Step 11—Dialog box allowing user to enter new file prefix and suffix
  a) Check box—User can select to import viewports from corresponding Interim Parent Files.
  b) User selects proceed command Step 12—Logic=files names from Interim Parent Files are extracted and a new cad file is created from the prior selected CAD template file and populated with mapped attributes from Interim Parent Files with corresponding file name to be saved as (new prefix)-filename-(new suffix).dwg Step 13—Dialog box allowing user to browse and select folder directories to create New Design XREF files, New Design Contract Sheets and/or New Design Demo Sheets. File creation progress bar is displayed Step 14—New files are created—File Creator Completed Message, output text file is written listing drawing files created and files not processed due to errors FIG. 25 is a flowchart of the operation of an automated XREF CAD file attachment software module, in an aspect. It should be understood that this process, and other processes described herein, do not have to be carried out in this particular order and do not require all of these steps. In fact, other steps could be incorporated into the process shown in FIG. 25 and/or one or more steps could be omitted.

Step 1—Launch XREF File Attacher

Step 2—User navigates to project directory and selects desired project Design and Demo Contract Sheets Step 3—Read contract sheet file names to derive concatenated logic for XREF files that should be associated with each file Step 4—Dialog box allowing user to browse to XREF folder directory to select existing Interim Parent Files and Design XREF files to process—allows for filtered search of directory Step 5—Selected XREF file names are validated for a correlation with selected Design and Demo Contract Sheet file names Step 6—Do selected Design and Demo Contract Sheet file names correlate with selected XREF file names?

Step 7—User selects proceed command File Progress Bar is displayed. Message Box is displayed validating that file name correlations have completed Step 8—Open each Contract Sheet File and attach correlated XREF (interim parent and Design) files to Design and Demo Contract Sheet files, overlay, relative path, modelspace, layer XREF, 0,0—save file Step 9—End Program. Write report on files processed Step 10—Message Box showing error that selected Contract Sheet files could not be correlated with selected XREF files. End program.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range. Further, described ranges are intended to include numbers outside any range described within statistical error and/or inherent measurement equipment limitations.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. An operations and maintenance design drawing conformance process for protecting the integrity of dynamically modified files, comprising:
  downloading or copying a Record Drawing File from a Document Management System;
  conforming the Record Drawing File for CADD standards;

reindexing the conformed Record Drawing File into the Document Management System;

renaming the conformed downloaded or copied Record Drawing File with a prefix and unique suffix to create an Interim Parent File;

creating a Demolition Layer that includes demolition objects to be removed in the Interim Parent File;

creating a Correctives Layer that includes existing conditions that require drawing correctives for content or location in the Interim Parent File;

changing demolition objects to the Demolition Layer within the Interim Parent File;

creating a Design XREF File with a prefix and matching Interim Parent File Unique Identifier suffix which allows a user to discern that an edit to an existing Record Drawing File is required and which also prevents overwrite of data by concurrent changes occurring to the same Record Drawing File by other projects using the same sourced Record Drawing File;

creating a new Demolition Construction Sheet File with matching Interim Parent File Unique Identifier suffix with an additional designator to distinguish that this document is for demolition purposes and externally referencing into the new Demolition Construction Sheet File's model space, the corresponding Interim Parent File with the matching Unique Identifier suffix and saving this file in a separate directory designated for Construction Documents to be plotted and distributed for construction activities; and, creating a new Design Construction Sheet File with matching Interim Parent File Unique Identifier suffix and externally referencing into the new Design Construction Sheet File's model space, the corresponding Interim Parent File and Design XREF file, wherein performance of the operations and maintenance design drawing conformance process reduces loss and/or overwrite of data in the Record Drawing File.

2. The process according to claim 1, wherein downloading is from a remote database.

3. The process according to claim 1, wherein conforming includes validating and applying Layer standards, validating Borders as externally referenced entities, inserting Border Informational Text into a paper space layout to allow for Variable information to be managed and maintained, allowing for mapped values into the Document Management System, and moving historical text, dimensions and notes found in paper space into model space to their correct spatial locations and applying an appropriate scale factor to this information to ensure legibility and that all historical data can be correctly used within the process.

4. The process according to claim 1, wherein conforming includes re-indexing the conformed Record Drawing File into the Document Management System prior to the creation of the Interim Parent File to ensure that all drawing historical data, now in model space, is saved, available and can be correctly used within the process.

5. The process according to claim 1, wherein renaming uses a prefix which designates a demolition XREF file type and a Unique Project Identifier suffix that allows the user to discern that an edit to an existing Record Drawing File is required, while also preventing overwrite of data by concurrent changes occurring to other copies of the same source Record Drawing File by other files with the Unique Project Identifier suffix.

6. The process according to claim 5, further comprising saving the Interim Parent File in a separate directory designated for XREF Files used for file compositions in the new Demolition Construction Sheet File and new Design Construction Sheet File.

7. The process according to claim 1, further comprising making sure that the origins of both the Record Drawing File and the Design XREF File are in the same spatial location and using the overlay method externally referencing in the Interim Parent File's model space into the Design XREF File's model space.

8. The process according to claim 1, wherein creating the Design XREF File further comprises freezing or turning off the Demolition and Correctives layers of the corresponding externally referenced Interim Parent File.

9. The process according to claim 1, wherein creating the new Design XREF File further comprises saving the Design XREF File in a separate directory designated for XREF Files used for file compositions in the new Design Construction Sheet Files.

10. The process according to claim 1, wherein creating the Design XREF File further comprises placing all new items to be added during the construction project on the appropriate discipline specific layers within model space with relative spatial location to the Interim Parent File, wherein all layer names used in the Record Drawing File, Interim Parent File, and the Design XREF File should be exactly the same in naming convention with the entity properties set to by layer.

11. The process according to claim 1, further comprising creating a Correctives layer in the Interim Parent File.

12. The process according to claim 11, further comprising correcting items in the Interim Parent File by means of copying and moving them to correct desired coordinate location in model space of the Design XREF File, wherein in the Design XREF file, the Interim Parent File layer names will be preserved and the entities will be forced to grayscale in color within the Design XREF File, and further comprising placing the items that were selected for edit in the Interim Parent File on the Correctives layer after completion of copying corrective items into the Design XREF File.

13. The process according to claim 11, further comprising of placing items for removal during construction on the Demolition Layer in the Interim Parent file.

14. The process according to claim 1, wherein creating the new Demolition Construction Sheet File includes freezing the Correctives Layer if it is being used to remove an existing condition and placing notes and call out leaders on the appropriate layers in paper space, as these notes relate to construction activities only and will not be retained as historical information for incorporation into the Record Drawing File.

15. The process according to claim 1, wherein creating the new Design Construction Sheet File includes freezing the Demolition and Correctives layers.

16. The process according to claim 1, wherein creating the new Design Construction Sheet File includes externally referencing into the new Design Construction Sheet File the Design XREF File, and placing notes and call out leaders on the appropriate layers in paper space, as these notes relate to construction activities only and will not be retained as historical information for incorporation into the Record Drawing File.

17. The process according to claim 1, wherein colors are used to differentiate at least one of the layers, files and operations to be performed.

18. The process according to claim 1, further comprising:
conforming the Interim Parent File and making revisions the Interim Parent File for any field revisions that occurred during construction activities;
conforming the Design XREF File including making revisions to the Design XREF File if necessary for any field revisions that occurred during construction activities;
updating the Revision Block in the new Demolition Construction Sheet File and deleting key notes, demolition notes and call out leaders from paper space;
updating the Revision Block in the new Design Construction Sheet File; and,
routing conformed As-Built drawings, comprising the new Demolition Construction Sheet File and new Design Construction Sheet File, for approval to apply the changes to a Record Drawing File.

19. The process according to claim 1, further comprising:
downloading or copying the Record Drawing File from the Document Management System to a working location;
using available spatial analysis processes to query in the Demolition layer and the Corrective layer from the Interim Parent File model space and delete duplicates to remove Record Drawing File objects from the model space that appear on the Demolition layer and the Corrective layer from the Interim Parent File;
deleting Demolition and Corrective layers previously queried into the record Drawing File's model space;
at least one of externally referencing, binding, inserting and exploding a Design XREF File into the Record Drawing File's model space; and,
plotting Record Drawing File and routing the plotted Record Drawing File for final approval prior to indexing the Record Drawing File into the Document Management System.

20. The process according to claim 1, further comprising using available spatial analysis processes, attaching the Design XREF File to a task pane to perform a query that will draw all Design XREF File layers found in model space into the Record Drawing File's model space and adjust all entity colors to BYLAYER with an alter property command executed during the query action.

* * * * *